(12) United States Patent
Kim et al.

(10) Patent No.: US 12,419,178 B2
(45) Date of Patent: Sep. 16, 2025

(54) LIGHT BLOCKING MEMBER OF COLOR CONVERSION SUBSTRATE AND DISPLAY DEVICE INCLUDING THE SAME

(71) Applicant: Samsung Display Co., LTD., Yongin-si (KR)

(72) Inventors: Wal Jun Kim, Hwaseong-si (KR); Hyunbae Park, Seoul (KR); Kiwan Ahn, Seoul (KR); Yongjae Jang, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 424 days.

(21) Appl. No.: 18/083,923

(22) Filed: Dec. 19, 2022

(65) Prior Publication Data

US 2023/0345791 A1   Oct. 26, 2023

(30) Foreign Application Priority Data

Apr. 26, 2022   (KR) .................. 10-2022-0051610

(51) Int. Cl.
*H10K 59/38* (2023.01)
*H10K 50/844* (2023.01)
*H10K 50/86* (2023.01)
*H10K 59/12* (2023.01)

(52) U.S. Cl.
CPC .......... *H10K 59/38* (2023.02); *H10K 50/844* (2023.02); *H10K 50/865* (2023.02); *H10K 59/12* (2023.02)

(58) Field of Classification Search
CPC .......... H10K 50/865; H10K 59/8792; H10K 50/844; H10K 59/38; H10K 50/8426
See application file for complete search history.

(56) References Cited

U.S. PATENT DOCUMENTS

| | | | |
|---|---|---|---|
| 9,651,806 B2 * | 5/2017 | Senokuchi | G02F 1/133308 |
| 2010/0079718 A1 * | 4/2010 | Sekiya | G02F 1/133512 |
| | | | 349/153 |
| 2017/0076678 A1 * | 3/2017 | Lee | G02F 1/1336 |
| 2020/0004074 A1 * | 1/2020 | Nagasawa | G02F 1/1339 |

FOREIGN PATENT DOCUMENTS

KR   101809259 B1   12/2017

* cited by examiner

*Primary Examiner* — Nduka E Ojeh
(74) *Attorney, Agent, or Firm* — CANTOR COLBURN LLP

(57) ABSTRACT

A color conversion substrate includes a base substrate including a display area and a non-display area which is adjacent to the display area in a first direction, a color filter layer in the display area, a light blocking member in the non-display area, extending in the first direction and defining a pattern groove of the light blocking member, the pattern groove being in the non-display area, and a refractive layer facing the base substrate with both the color filter layer and the light blocking member therebetween. The refractive layer extends into the pattern groove of the light blocking member and fills the pattern groove.

20 Claims, 17 Drawing Sheets

LIGHT BLOCKING MEMBER OF COLOR CONVERSION SUBSTRATE AND DISPLAY DEVICE INCLUDING THE SAME

This application claims priority to Korean Patent Application No. 10-2022-0051610, filed on Apr. 26, 2022, and all the benefits accruing therefrom under 35 U.S.C. § 119, the content of which in its entirety is herein incorporated by reference.

BACKGROUND

1. Field

Embodiments of the invention relate to a color conversion substrate and display device including the color conversion substrate.

2. Description of the Related Art

The flat panel display is used as a display device to replace the cathode ray tube display, due to characteristics such as light weight and thinness of the flat panel display. Representative examples of such flat panel display devices include a liquid crystal display device and an organic light emitting display device.

In order to improve display quality, a display device including a display substrate including a plurality of pixels, and a color conversion substrate including a color filter and a color conversion part, has been proposed. The color conversion part may convert a wavelength of incident light provided from the display substrate. Accordingly, the display device including the color conversion part may emit light having a color different from that of the incident light. For example, the color conversion part may include wavelength conversion particles such as quantum dots.

SUMMARY

Embodiments provide a color conversion substrate which reduces or effectively prevents penetration of impurities to inner layers of a display device.

Embodiments provide a display device including the color conversion substrate.

A color conversion substrate according to an embodiment includes a base substrate including a display area, a peripheral area disposed outside the display area, and a sealing area disposed outside the peripheral area, a color filter layer disposed in the display area under the base substrate, a light blocking member disposed in the peripheral area and the sealing area under the base substrate, extending in a first direction which is a longitudinal direction of the base substrate, and including a pattern groove, and a refractive layer facing both the color filter layer and the light blocking member. A portion of the refractive layer fills the pattern groove.

In an embodiment, the light blocking member may include a grooved area in which the pattern groove is disposed, and a flat portion adjacent to the groove portion in the first direction. A first shortest distance between the lower surface of a protruding portion in the grooved area of the light blocking member and the lower surface of the refractive layer may be smaller than a second shortest distance between the lower surface of the flat portion of the light blocking member and the lower surface of the refractive layer.

In an embodiment, the first shortest distance may be about 0.5 micrometer (μm) or less.

In an embodiment, the pattern groove may be disposed in the sealing area.

In an embodiment, the pattern groove may overlap the sealing member in the sealing area.

In an embodiment, the pattern groove may be disposed in the sealing area and the peripheral area.

In an embodiment, the pattern groove may be adjacent to the display area.

In an embodiment, the light blocking member may include a first light blocking layer disposed on a lower surface of the base substrate and extending in the first direction, a second light blocking layer disposed on a lower surface of the first light blocking layer, overlapping the first light blocking layer in a second direction perpendicular to the first direction, and extending in the first direction, a third light blocking layer disposed on a lower surface of the second light blocking layer, overlapping the first light blocking layer and the second light blocking layer in the second direction, and extending in the first direction.

In an embodiment, the pattern groove may penetrate the third light blocking layer and expose a portion of the second light blocking layer In an embodiment, the pattern groove may penetrate the second light blocking layer and the third light blocking layer and expose a portion of the light blocking layer.

In an embodiment, the pattern groove may penetrate the first light blocking layer, the second light blocking layer, and the third light blocking layer and expose a portion of the base substrate.

In an embodiment, the light blocking member may further include an organic layer disposed on a lower surface of the third light blocking layer, overlapping the first to third light blocking layers in the second direction, and extending in the first direction, and the pattern groove may penetrate the organic layer and expose a portion of the third light blocking layer.

In an embodiment, the first light blocking layer may be a blue light blocking layer, the second light blocking layer may be a red light blocking layer, and the third light blocking layer may be a green light blocking layer.

In an embodiment, the color filter layer may include a red color filter, a green color filter, and a blue color filter, and the red color filter and the red light blocking layer may include the same material, the green color filter and the green light blocking layer may include the same material, and the blue color filter and the blue light blocking layer may include the same material.

In an embodiment, the color conversion substrate may further include a first color conversion part disposed under the color filter layer to correspond to the red color filter, a second color conversion part disposed under the color filter layer to correspond to the green color filter, and a light transmission part disposed under the color filter layer to correspond to the blue color filter.

In an embodiment, the first color conversion part may include first wavelength conversion particles that convert an incident light into a light having a red color, the second color conversion part may include second wavelength conversion particles that convert the incident light into a light having a green color, and the light transmission part may include a scatterer scattering the incident light.

In an embodiment, the color conversion substrate may further include a capping layer which faces the base substrate with the refractive layer therebetween.

A display device according to an embodiment includes a display substrate including a first base substrate and pixels disposed on the first base substrate, a color conversion substrate facing the display substrate, and a sealing member bonding the display substrate and the color conversion substrate to each other, and the color conversion substrate may include a second base substrate including a display area, a peripheral area disposed outside the display area, and a sealing area disposed outside the peripheral area, a color filter layer disposed in the display area under the second base substrate, a light blocking member disposed in the peripheral area and the sealing area under the second base substrate, extending in a first direction which is a longitudinal direction of the second base substrate, and including a pattern groove, and a refractive layer surrounding the color filter layer and the light blocking member, and a portion of the refractive layer fills the pattern groove.

In an embodiment, the light blocking member may include a groove portion (e.g., a grooved area) in which the pattern groove is disposed, and a flat portion adjacent to the groove portion in the first direction, and a first shortest distance between the lower surface of the groove portion of the light blocking member and the lower surface of the refractive layer may be smaller than a second shortest distance between the lower surface of the flat portion of the light blocking member and the lower surface of the refractive layer.

In an embodiment, the sealing member may overlap the pattern groove.

Therefore, the display device according to embodiments may include a display substrate and a color conversion substrate following the display substrate in a light emitting direction (e.g., a direction from the display substrate to the color conversion substrate). The color conversion substrate may include the light blocking member disposed in the peripheral area and the sealing area to surround the display area, and the refractive layer covering the light blocking member. The light blocking member may define the pattern groove, and a portion of the refractive layer may fill the pattern groove. Accordingly, the thickness of the refractive layer exposed to the outside of the display device may be reduced. Accordingly, it is possible to prevent or reduce the penetration of impurities such as external air and moisture into the inside of the display device through the refractive layer. Accordingly, the display quality of the display device may be improved.

It is to be understood that both the foregoing general description and the following detailed description are exemplary and explanatory and are intended to provide further explanation of the invention as claimed.

BRIEF DESCRIPTION OF THE DRAWINGS

Illustrative, non-limiting embodiments will be more clearly understood from the following detailed description taken in conjunction with the accompanying drawings.

DETAILED DESCRIPTION

Figure 1:
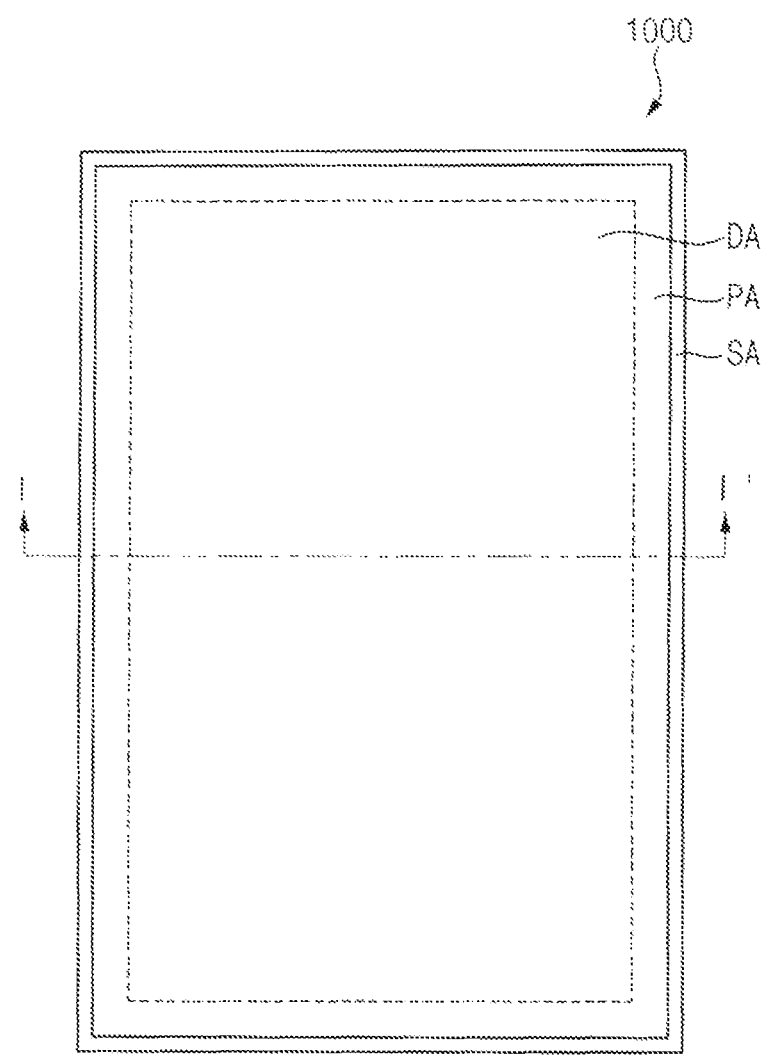
FIG. 1 is a plan view illustrating a display device according to an embodiment.

Illustrative, non-limiting embodiments will be more clearly understood from the following detailed description in conjunction with the accompanying drawings.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

Like reference numerals refer to like elements throughout. As used herein, a reference number may indicate a singular element or a plurality of the element. For example, a reference number labeling a singular form of an element within the drawing figures may be used to reference a plurality of the singular element within the text of specification It will be understood that when an element is referred to as being related to another element such as being "on" another element, it can be directly on the other element or intervening elements may be present therebetween. In contrast, when an element is referred to as being related to another element such as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Figure 2:
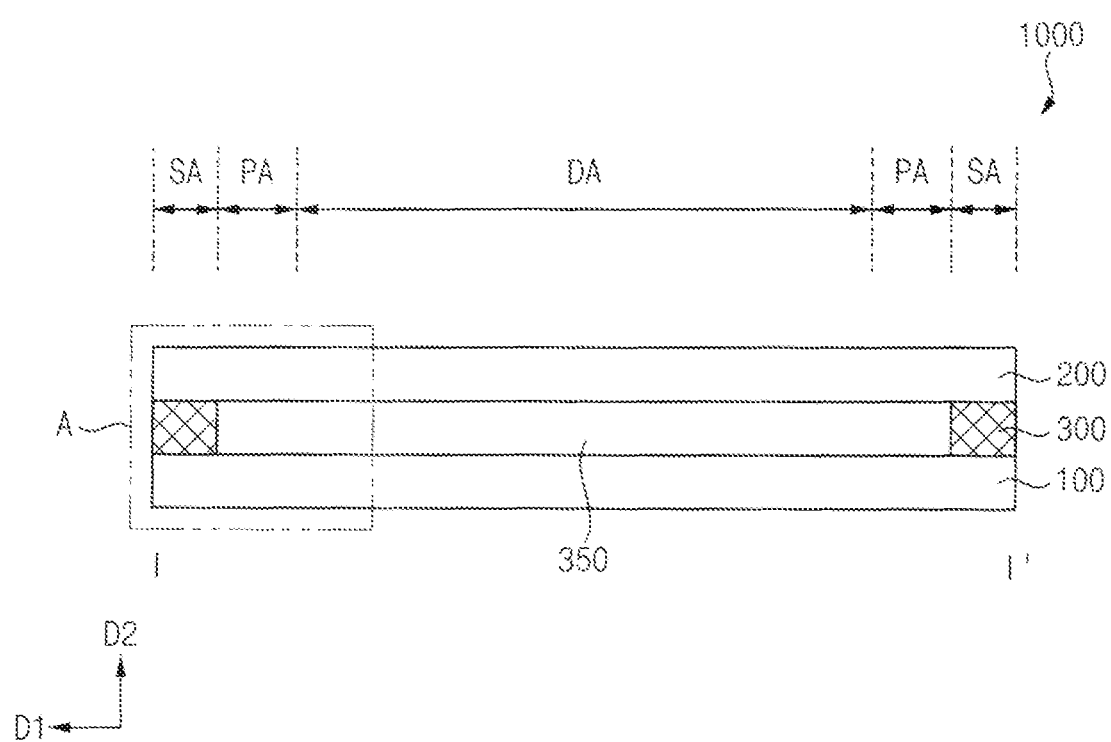
FIG. 2 is a cross-sectional view taken along line I-I' of FIG. 1.

FIG. 1 is a plan view (e.g., plane view) illustrating a display device 1000 according to an embodiment. FIG. 2 is a cross-sectional view taken along line I-I' of FIG. 1.

Referring to FIGS. 1 and 2, a display device 1000 may include a first substrate 100, a second substrate 200, and a sealing member 300. The second substrate 200 may be disposed facing the first substrate 100, with the sealing member 300 therebetween. The sealing member 300 may bond the first substrate 100 and the second substrate 200 to each other.

The display device 1000 (e.g., each of the first substrate 100 and the second substrate 200) may include a display area DA at which an image is displayed, a non-display area at which the image is not displayed, a peripheral area PA disposed adjacent to the display area DA, and a sealing area SA disposed adjacent to the peripheral area PA. The peripheral area PA may be disposed outside the display area DA. For example, the peripheral area PA may surround the display area DA in a plan view. The sealing area SA may be disposed outside the peripheral area PA, that is, further from the display area DA than the peripheral area PA. For example, the sealing area SA may surround the peripheral area PA in a plane view. An image may not be displayed at the sealing area SA and the peripheral area PA, such as to define a non-display area. Various components or layers of the display device 1000 may include a display area DA, a peripheral area PA, a sealing area and/or a non-display area corresponding to those described above.

The display device 1000 may be disposed extended in a plane which is defined by two directions crossing each other. A plane view may be a view of that plane, such as along a second direction D2. The second direction D2 may define a thickness direction of the display device 1000 and various components or layers thereof. The horizontal direction of FIGS. 1 and 2 indicates a first direction D1. A vertical direction of FIG. 1 and a direction into the view of FIG. 2 may indicate a third direction, where the third direction may cross the first direction D1 to provide the plane, without being limited thereto The first substrate 100 may include a plurality of pixels and may be referred to as a display substrate. The pixels may be disposed in the display area DA of the first substrate 100. Each of the pixels may include a driving device and a light emitting device which is connected to the driving device. The driving device may include at least one thin film transistor and at least one capacitor. The light emitting device may generate light according to a driving signal, such that the pixel may also be referred to as a display element which generates and/or emits light for displaying an image. For example, the light emitting device within a display element may be an inorganic light emitting diode or an organic light emitting diode.

The second substrate 200 may include a color conversion part and may be referred to as a color conversion substrate. The sealing member 300 may bond the color conversion substrate to a display substrate which emits light toward the color conversion substrate. The color conversion part may be disposed in the display area DA and may convert a wavelength of light generated from the light emitting device of the first substrate 100, such as to wavelength-convert and/or color-convert light. The second substrate 200 may further include a color filter layer that transmits a light of a specific color. The color filter may not wavelength-convert or color-convert light, without being limited thereto.

The sealing member 300 may bond the first substrate 100 and the second substrate 200 to each other. The sealing member 300 may be disposed in the sealing area SA, between the first substrate 100 and the second substrate 200. For example, the sealing member 300 may be disposed in the sealing area SA, between the first substrate 100 and the second substrate 200, to surround the peripheral area PA in a plane view. In an embodiment, the non-display area includes a sealing area SA at which the color conversion substrate is coupled to a display substrate which emits incident light toward the color conversion substrate, and a peripheral area PA between the display area DA and the sealing area SA, along the first direction D1.

In an embodiment, the sealing member 300 may have a flat shape of a hollow quadrangle, to correspond to a planar shape of the first substrate 100 and/or the second substrate 200. However, the invention is not limited thereto, and the sealing member 300 may have various planar shapes depending on a planar shape of the first substrate 100 or the second substrate 200. For example, when the first substrate 100 or the second substrate 200 has the planar shape such as a triangle, a rhombus, a polygon, a circle, or an oval, the sealing member 300 may have the planar shape such as a hollow triangle, a hollow rhombus, a hollow empty polygon, a hollow circle, or a hollow oval.

In an embodiment, a filling layer 350 may be disposed between the first substrate 100 and the second substrate 200.

For example, the filling layer 350 may act as a buffer against external pressure applied to the display device 1000, e.g., an impact-absorbing layer or pattern. For example, the filling layer 350 may maintain a gap between the first substrate 100 and the second substrate 200 along the thickness direction. In an embodiment, the filling layer 350 may be omitted.

Figure 3:
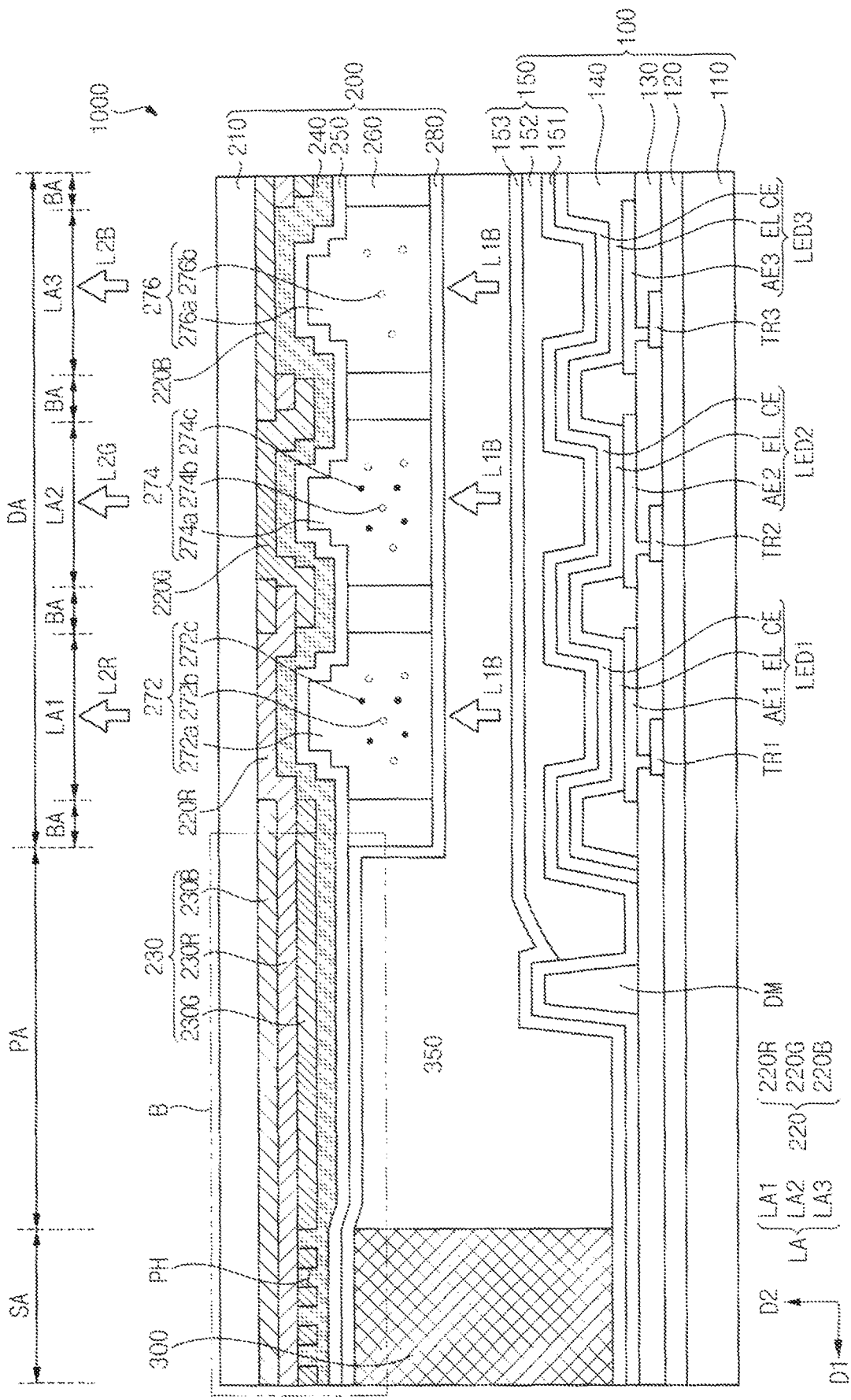
FIG. 3 is an enlarged view of area 'A' of FIG. 2.

FIG. 3 is an enlarged view of area 'A' of FIG. 2.

Referring to FIGS. 1 to 3, the display area DA may include a light emitting area LA and a light blocking area BA. A light L1B generated from the first substrate 100 and incident to the second substrate 200 (hereinafter, an incident light L1B) may be emitted to the outside (e.g., outside of the display device 1000) through the light emitting area LA. For example, the incident light L1B may have a blue color. The light emitting area LA may include first to third light emitting areas LA1, LA2, and LA3 at which light of different colors is respectively emitted. For example, the first light emitting area LA1 may emit a first transmitted light L2R having a red color, and the second light emitting area LA2 may emit a second transmitted light L2G having a green color, The third light emitting area LA3 may emit the third transmitted light L2B having a blue color.

In an embodiment, the first to third light emitting areas LA1, LA2, and LA3 may be spaced apart from each other in a plane view and arranged to repeat in a direction along the first substrate 100. The light blocking area BA may be adjacent to a respective light emitting area, such as to surround the first to third light emitting areas LA1, LA2, and LA3 in a plan view. For example, the light blocking area BA may have a grid shape in a plan view.

In an embodiment, the first substrate 100 may include a first base substrate 110, a buffer layer 120, first to third driving devices TR1, TR2, TR3, an insulating structure 130, and a pixel defining layer 140, first to third light emitting devices LED1, LED2, and LED3, and an encapsulation layer 150.

The first base substrate 110 may be an insulating substrate formed of a transparent or opaque material. In an embodiment, the first base substrate 110 may include glass. In this case, the first substrate 100 may be a rigid display substrate. In an embodiment, the first base substrate 110 may include plastic. In this case, the first substrate 100 may be a flexible display substrate.

The buffer layer 120 may be disposed on the first base substrate 110. The buffer layer 120 may prevent impurities such as oxygen and moisture from diffusing to the upper portion of the first base substrate 110 through the first base substrate 110. The buffer layer 120 may include an inorganic insulating material such as a silicon compound or a metal oxide. Examples of the inorganic insulating material may include silicon oxide (SiO), silicon nitride (SiN), silicon oxynitride (SiON), silicon oxycarbide (SiOC), silicon carbonitride (SiCN), aluminum oxide (AlO), aluminum nitride (AlN), tantalum oxide (TaO), hafnium oxide (HfO), zirconium oxide (ZrO), titanium oxide (TiO), and the like. These may be used alone or in combination with each other. The buffer layer 120 may have a single-layer structure or a multi-layer structure including a plurality of insulating layers.

The first to third driving devices TR1, TR2, and TR3 may be disposed in the display area DA on the buffer layer 120. Each of the first to third driving devices TR1, TR2, and TR3 may include at least one thin film transistor and at least one capacitor. The channel layer of the thin film transistor may include an oxide semiconductor, a silicon semiconductor, an organic semiconductor, or the like. For example, the oxide semiconductor may include at least one oxide of indium (In), gallium (Ga), tin (Sn), zirconium (Zr), vanadium (V), hafnium (Hf), cadmium (Cd), germanium (Ge), chromium (Cr), titanium (Ti), and zinc (Zn). The silicon semiconductor may include amorphous silicon, polycrystalline silicon, or the like.

The insulating structure 130 as an insulating layer, may cover the first to third driving devices TR1, TR2, and TR3. The insulating structure 130 may include a combination of an inorganic insulating layer and an organic insulating layer.

First to third pixel electrodes AE1, AE2, and AE3 may be disposed on the insulating structure 130. Each of the first to third pixel electrodes AE1, AE2, and AE3 may include a conductive material such as a metal, an alloy, a conductive metal nitride, a conductive metal oxide, or a transparent conductive material. Each of the first to third pixel electrodes AE1, AE2, and AE3 may have a single-layer structure or a multi-layer structure including a plurality of conductive layers.

The pixel defining layer 140 may be disposed on the first to third pixel electrodes AE1, AE2, and AE3. Solid portions of the pixel defining layer 140 may correspond to an area respectively between the first to third pixel electrodes AE1, AE2, and AE3. The pixel defining layer 140 may include an organic insulating material. Examples of the organic insulating material may include photoresist, polyacryl-based resin, polyimide-based resin, polyamide-based resin, siloxane-based resin, acryl-based resin, epoxy-based resin, and the like. These may be used alone or in combination with each other. The pixel defining layer 140 (e.g., solid portions thereof) may define a pixel opening exposing at least a portion of each of the first to third pixel electrodes AE1, AE2, and AE3 to outside the pixel defining layer 140.

An emission layer EL may be disposed on the first to third pixel electrodes AE1, AE2, and AE3 exposed by the pixel opening of the pixel defining layer 140. In an embodiment, the emission layer EL may extend continuously on the display area DA, across the plurality of pixels. In an embodiment, the emission layer EL may not be continuous, and may include a plurality of emission layer patterns which are separated from each other, such as an emission layer pattern of one pixel being spaced apart from an emission layer pattern of an adjacent pixel, along the first base substrate 110.

The emission layer EL may include at least one of an organic light emitting material and quantum dots. In an embodiment, the emission layer EL may generate blue light. In other words, the emission layer EL may include an organic material for emitting blue light. However, the invention is not necessarily limited thereto, and the emission layer EL may generate red light or green light, or may generate lights having different colors according to pixels.

When the emission layer EL generates blue light, in an embodiment, the light emission layer EL may have a structure in which a plurality of blue organic emission layers are stacked. For example, the emission layer EL may have a structure in which three blue organic emission layers are stacked. However, the invention is not necessarily limited thereto, and in an embodiment, the emission layer EL may have a structure in which a plurality of blue organic emission layers and an organic emission layer emitting light of a color other than blue are stacked. For example, the emission layer EL may have a structure in which three blue organic emission layers and one green organic emission layer are stacked.

A common electrode CE may be disposed on the emission layer EL. The common electrode CE may include a conductive material such as a metal, an alloy, a conductive metal nitride, a conductive metal oxide, or a transparent conductive material. The common electrode CE may have a single-layer structure or a multi-layer structure including a plurality of conductive layers. In an embodiment, the common electrode CE may continuously extend over the plurality of pixels on the display area DA.

The first pixel electrode AE1, the emission layer EL, and the common electrode CE may together form the first light emitting device LED1, the second pixel electrode AE2, the emission layer EL and the common electrode CE may together form the second light emitting device LED2, and the third pixel electrode AE3, the emission layer EL and the common electrode CE may together form the third light emitting device LED3.

Although not shown, a hole control layer may be disposed between a respective pixel electrode among the first to third pixel electrodes AE1, AE2, and AE3, and a corresponding one of the emission layer EL. The hole control layer may include a hole transport layer and may further include a hole injection layer. An electron control layer may be disposed between the emission layer EL and the common electrode CE. The electron control layer may include an electron transport layer and may further include an electron injection layer.

The encapsulation layer 150 may be disposed on the common electrode CE. The encapsulation layer 150 may include at least one inorganic encapsulation layer and at least one organic encapsulation layer. In an embodiment, the encapsulation layer 150 may include a first inorganic encapsulation layer 151 disposed on the common electrode CE, an organic encapsulation layer 152 disposed on the first inorganic encapsulation layer 151, and a second inorganic encapsulation layer 153 disposed on the organic encapsulation layer 152. However, the invention is not necessarily limited thereto.

In an embodiment, a dam DM may be disposed in the peripheral area PA, on the first base substrate 110. For example, the dam DM may surround the display area DA in a plan view. The dam DM may prevent the organic material for forming the organic encapsulation layer 152 in the display area DA, from overflowing to the outside of the dam DM (e.g., in the first direction D1 in FIG. 3) during the formation of the organic encapsulation layer 152.

The second substrate 200 may be disposed in the second direction D2, from the encapsulation layer 150. Hereinafter, the second direction D2 may be referred to as a front direction or a thickness direction.

In an embodiment, the second substrate 200 may include a second base substrate 210, a color filter layer 220, a light blocking member 230 as a light blocking layer, a refractive layer 240, a first capping layer 250, and a barrier rib structure 260 as a barrier rib layer, a first color conversion part 272 as a first color conversion pattern, a second color conversion part 274 as a second color conversion pattern, a light transmission part 276 as a light transmission pattern, and a second capping layer 280. The color conversion part of the second substrate 200 may include the barrier rib layer, the first color conversion part 272, the second color conversion part 274, and the light transmission part 276, with or without remaining layers of the second substrate 200. A color conversion layer of the second substrate 200 may include the barrier rib layer, the first color conversion part 272, the second color conversion part 274 and the light transmission part 276.

The second base substrate 210 may be an insulating substrate formed of or including a transparent material. The second base substrate 210 may include glass or plastic. The second base substrate 210 may include the display area DA, the peripheral area PA, and the sealing area SA as described above.

The color filter layer 220 may be disposed in the display area DA under the second base substrate 210. In an embodiment, the color filter layer 220 may include color filter patterns including a red color filter 220R, a green color filter 220G, and a blue color filter 220B.

The red color filter 220R may overlap (or correspond to) the first light emitting area LA1 and may selectively transmit red light. The green color filter 220G may overlap the second light emitting area LA2 and may selectively transmit green light. The blue color filter 220B may overlap the third light emitting area LA3 and may selectively transmit blue light.

In an embodiment, each of the red color filter 220R, the green color filter 220G, and the blue color filter 220B may be disposed to further overlap the light blocking area BA, such as extending from a respective light emitting area to the light blocking area BA. That is, as shown in FIG. 3, the red color filter 220R may overlap the first light emitting area LA1 and the light blocking area BA, but may not overlap the second and third light emitting areas LA2 and LA3. The green color filter 220G may overlap the second light emitting area LA2 and the light blocking area BA, but may not overlap the first and third light emitting areas LA1 and LA3. The blue color filter 220B may overlap the third light emitting area LA3 and the light blocking area BA, but may not overlap the first and second light emitting areas LA1 and LA2. In this case, in the light blocking area BA, portions of the red, green, and blue color filters 220R, 220G, and 220B may overlap each other in (or along) the second direction D2 to define a respective light blocking pattern. Accordingly, color mixing between the adjacent first to third light emitting areas LA1, LA2, and LA3 may be prevented.

The light blocking member 230 may be disposed in the peripheral area PA and the sealing area SA, under the second base substrate 210. For example, the light blocking member 230 may extend in the first direction D1 and the third direction to surround the display area DA in a plan view, so that disposed in the peripheral area PA and the sealing area SA, under the second base substrate 210. The light blocking member 230 may prevent circuit structures such as wirings and a driving circuit disposed in the peripheral area PA of the first substrate 100 from being viewed from the outside of the display device 1000. In addition, the light blocking member 230 may prevent light reflected from the circuit structures or light emitted from the display area DA from being emitted in the front direction (e.g., in the second direction D2) at the peripheral area PA and the sealing area SA of the second base substrate 210.

The light blocking member 230 may include a plurality of light blocking layers or light blocking portions stacked on each other along the second direction D2. The plurality of light blocking layers may extend in the first direction D1 (and the third direction) and overlap each other in the second direction D2. For example, the light blocking member 230 may include a first light blocking layer 230B, a second light blocking layer 230R, and a third light blocking layer 230G, in order from the second base substrate 210, along the second direction D2. Each of the first to third light blocking layers 230B, 230R, and 230G may extend in the first direction D1 and overlap each other in the second direction D2. Accordingly, the light blocking member 230 may effectively block light traveling in the second direction D2.

In an embodiment, the first light blocking layer 230B may be disposed on the lower surface of the second base substrate 210, the second light blocking layer 230R may be disposed on the lower surface of the first light blocking layer 230B, and the third light blocking layer 230G may be disposed on the lower surface of the second light blocking layer 230R. In other words, the third light blocking layer 230G may be disposed at the lowest portion of the light blocking member 230, to be furthest from the second base substrate 210 (or closest to the first substrate 100) from among the three light blocking layers. However, the invention is not necessarily limited thereto. In an embodiment, the second light blocking layer 230R may be disposed on the lowest portion of the light blocking member 230, or the first light blocking layer 230B may be disposed on the lowest portion of the light blocking member 230.

In an embodiment, the first light blocking layer 230B may be a blue light blocking layer, the second light blocking layer 230R may be a red light blocking layer, and the third light blocking layer 230G may be a green light blocking layer. In this case, the first light blocking layer 230B may include the same material as the blue color filter 220B, and the second light blocking layer 230R may include the same material as the red color filter 220R, and the third light blocking layer 230G may include the same material as the green color filter 220G. In other words, the first light blocking layer 230B may be formed (or provided) together with the blue color filter 220B, the second light blocking layer 230R may be formed (or provided) together with the red color filter 220R, and the third light blocking layer 230G may be formed (or provided) together with the green color filter 220G. As being formed together in a same process and/or as including a same material, elements may be in a same layer as each other as respective portions of a same material layer, may be on a same layer by forming an interface with a same underlying or overlying layer, etc., without being limited thereto.

Figure 4:
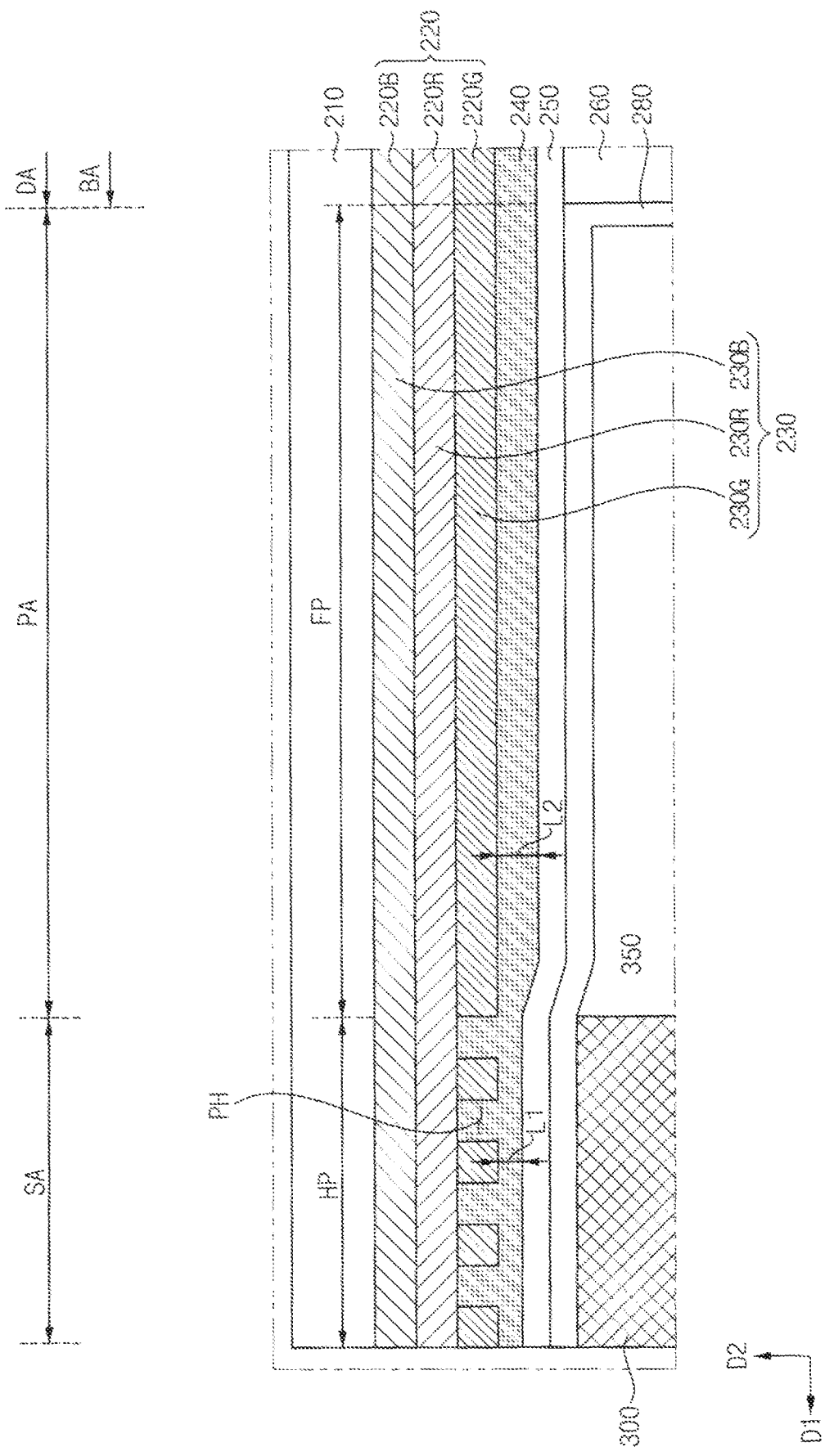
FIG. 4 is an enlarged view of area 'B' of FIG. 3.

FIG. 4 is an enlarged view of area 'B' of FIG. 3.

Referring to FIGS. 1 to 4, a pattern groove PH may be formed in the light blocking member 230, such as being provided by solid portions of the light blocking member 230. Accordingly, the light blocking member 230 may be divided into a groove portion HP (e.g., a grooved area) in which the pattern groove PH is disposed or define, and a flat portion FP in which the pattern groove PH is not disposed or omitted. The flat portion FP may be adjacent to the groove portion HP in the first direction D1. That flat portion FP may be closer to the display area DA than the grooved portion, in a direction along a respective base substrate.

In an embodiment, the pattern groove PH may be formed by adjusting a transmissive area and a non-transmissive area of an exposure mask during a plurality of exposure and development processes for forming the light blocking member 230. In this case, the transmissive area may be an area (e.g., a planar area) through which exposure light from an exposure machine is transmitted, and the non-transmissive area may be an area which blocks the exposure light from the exposure machine.

For example, as shown in FIGS. 3 and 4, the pattern groove PH may be formed by selectively patterning the third light blocking layer 230G at a specific position along the respective base substrate. In this case, the pattern groove PH may penetrate a thickness of the third light blocking layer 230G, and may expose a portion of the second light blocking layer 230R to outside the third light blocking layer 230G. The pattern groove PH may be filled by a portion of the refractive layer 240 which extends into the pattern groove PH, in the process of forming the refractive layer 240.

In an embodiment, a plurality of pattern grooves PH may be provided, spaced apart from each other. Although FIG. 3 illustrates that four pattern grooves PH are defined in the light blocking member 230, the number of pattern grooves PH is not necessarily limited thereto. In an embodiment, each of the plurality of pattern grooves PH may be spaced apart from each other at regular intervals in the direction along the respective base substrate.

In an embodiment, as shown in FIGS. 3 and 4, the cross-sectional shape of the inner surface of the pattern groove PH (e.g., a sidewall of the respective light blocking layer which defines the pattern groove PH) may have a linear shape in cross-section view. However, the invention is not necessarily limited thereto. In an embodiment, the shape of the inner surface of the pattern groove PH may have a curved shape in cross-section view. In addition, when a plurality of pattern grooves PH are provided, the shape of the inner surface of each of the plurality of pattern grooves PH may be any one of the linear shape and the curved shape in cross-section view. In other words, in cross-section view, the shape of the inner surface of the plurality of pattern grooves PH may be a linear shape, a curved shape, or a combination thereof.

In an embodiment, the pattern groove PH may be disposed in the sealing area SA. In other words, the groove portion HP of the light blocking member 230 may overlap the sealing area SA. Accordingly, the pattern groove PH may overlap the sealing member 300 in the sealing area SA. In this case, the flat portion FP of the light blocking member 230 may overlap the peripheral area PA.

The refractive layer 240 may be disposed under the second base substrate 210. The refractive layer 240 may be entirely disposed in the display area DA, the peripheral area PA, and the sealing area SA. In an embodiment, the refractive layer 240 may be disposed in an entirety of in the display area DA, the peripheral area PA, and the sealing area SA. For example, the refractive layer 240 may surround (e.g., may cover) the color filter layer 220 in the display area DA, and surround the light blocking member 230 in the peripheral area PA and the sealing area SA. The refractive layer 240 may control a path of light emitted from the lower portion of the display device 1000 (or the second substrate 200). For example, the refractive layer 240 may change the path of the obliquely incident light in the front direction (e.g., in the second direction D2). The change in the path may provide the incident light to be substantially parallel to the second direction D2, without being limited thereto. The refractive layer 240 may define a light path control layer, without being limited thereto. Accordingly, the refractive layer 240 may increase the luminous efficiency of the display device 1000.

In an embodiment, the refractive layer 240 may include hollow particles. The hollow particles may be dispersed in a resin matrix. The hollow particles may include an inorganic material. For example, the hollow particles may include silica (SiO2), magnesium fluoride (MgF2), iron oxide (Fe3O4), or a combination thereof. The resin matrix may include an acrylic resin, a siloxane-based resin, a urethane-based resin, an imide-based resin, and the like, and may be selected in consideration of refractive index and fairness.

In an embodiment, a portion of the refractive layer 240 may fill the pattern groove PH of the light blocking member 230. That is, in the process of coating, deposition, etc. for forming the refractive layer 240, the refractive layer 240 may be formed while filling the pattern groove PH and contacting each of sidewalls and an end surface of the respective light blocking layer providing the pattern grooves PH. Accordingly, a first shortest distance L1 between a lower surface of the groove portion HP of the light blocking member 230 (e.g., an end surface at a distal end of a protruding portion of the light blocking member 230), and a lower surface of the refractive layer 240, may be reduced or minimized at an area in which the pattern groove PH is defined. The lower surfaces may be furthest from the second base substrate 210. Accordingly, the first shortest distance L1 between the lower surface of the protruding pattern of the light blocking member 230 and the lower surface of the refractive layer 240, is smaller than the second shortest distance L2 between a lower surface of the flat portion FP of the light blocking member 230 and the lower surface of the refractive layer 240.

For example, as shown in FIGS. 3 and 4, when the groove portion HP defined by a plurality of protruding portions of the light blocking member 230 which are spaced apart from each other, overlaps the sealing area SA, the shortest distance between the lower surface of the light blocking member 230 and the lower surface of the refractive layer 240 in the sealing area SA may be smaller than the shortest distance between the lower surface of the light blocking member 230 and the lower surface of the refractive layer 240 in the peripheral area PA. Accordingly, the thickness of the refractive layer 240 exposed to the outside of the display device 1000 (or the second substrate 200) may be reduced. Accordingly, it is possible to prevent or reduce the penetration of impurities such as external air and moisture into the inside of the second substrate 200 through the refractive layer 240. Accordingly, the display quality of the display device 1000 may be improved.

In an embodiment, the first shortest distance L1 between the lower surface of the plurality of protruding portions of the light blocking member 230 in groove portion HP and the lower surface of the refractive layer 240 may be set by adjusting a width of the pattern groove PH which is defined along the first direction D1, a depth of the pattern grooves PH which is defined along the second direction D2, and an interval between the plurality of pattern grooves PH which is defined along the first direction D1. In other words, the thickness of the refractive layer 240 exposed to the outside may be set by adjusting the width of the pattern groove PH in the first direction D1, the depth of the pattern groove PH in the second direction D2, and the interval between the plurality of pattern grooves PH in the first direction D1.

In an embodiment, the first shortest distance L1 between the lower surface of the plurality of protruding portions of the light blocking member 230 and the lower surface of the refractive layer 240 may be about 0.5 micrometer (μm) or less. When the first shortest distance L1 satisfies the above range, it is possible to reduce a phenomenon in which the impurity penetrates the inside of the second substrate 200, from the outside through the refractive layer 240. Accordingly, the display quality of the display device 1000 may be further improved.

Referring back to FIGS. 1 to 3, the first capping layer 250 may be disposed under the second base substrate 210. The first capping layer 250 may be entirely disposed in the display area DA, the peripheral area PA, and the sealing area SA, that is, in an entirety of the display area DA, the peripheral area PA, and the sealing area SA. For example, the first capping layer 250 may surround (e.g., may cover) the refractive layer 240. In an embodiment, the first capping layer 250 may include an inorganic insulating material.

The barrier rib structure 260 as a barrier rib layer including a plurality of ribs spaced apart from each other may be disposed in the display area DA, under the color filter layer 220. A plurality of openings may be formed in the barrier rib structure 260, between adjacent ribs spaced apart from each other. For example, as shown in FIG. 3, the openings of the barrier rib structure 260 may expose the first to third light emitting areas LA1, LA2, and LA3, respectively, to outside the barrier rib structure 260. The barrier rib structure 260 may form a space for accommodating the ink composition or ink material forming a respective color conversion pattern (or a respective transmission pattern) in the process of forming the first color conversion part 272, the second color conversion part 274, and the light transmission part 276. For example, the barrier rib structure 260 may entirely overlap the light blocking area BA, and may have a grid shape in a plan view.

The barrier rib structure 260 may include an organic material. In an embodiment, the barrier rib structure 260 may further include a light blocking material. For example, at least a portion of the barrier rib structure 260 may include a light blocking material such as black pigment, dye, carbon black, or the like.

The first color conversion part 272, the second color conversion part 274, and the light transmission part 276 may be disposed in the display area DA, under the color filter layer 220, and respectively overlap the first to third light emitting areas LA1, LA2, LA3. For example, the first color conversion part 272, the second color conversion part 274, and the light transmission part 276 may be respectively disposed in the openings of the barrier rib structure 260 which correspond to the various light emitting areas.

The first color conversion part 272 may overlap the first light emitting area LA1. The first color conversion part 272 may convert the incident light L1B having a blue color into the first transmitted light L2R having a red color. For example, the first color conversion part 272 may include a resin 272a, a scatterer 272b as a light scatterer, and a wavelength conversion particle 272c as a wavelength conversion member.

The scatterer 272b may scatterer the incident light L1B without substantially changing the wavelength of the incident light L1B incident to the first color conversion part 272 to increase the light path. The scatterer 272b may include a metal oxide or an organic material. Optionally, the scatterer 272b may be omitted.

In an embodiment, the wavelength conversion particle 272c may include quantum dots. The quantum dots may be defined as semiconductor materials having nanocrystals. The quantum dots may have a specific bandgap according to their composition and size. Accordingly, the quantum dots may absorb incident light and emit light having a wavelength different from that of the incident light. For example, the quantum dots may have a diameter of about 100 nanometers (nm) or less, such as a diameter of about 1 nanometer (nm) to about 20 nm. For example, the wavelength conversion particles 272c of the first color conversion part 272 may include quantum dots that absorb blue light and emit red light.

The scatterer 272b and the wavelength conversion particle 272c may be disposed in the resin 272a. For example, the resin 272a may include an epoxy-based resin, an acrylic resin, a phenol-based resin, a melamine-based resin, a cardo-based resin, or an imide-based resin.

The first color conversion part 272 may convert the incident light L1B having a blue color to emit the first transmitted light L2R having a red color. The blue light not converted by the first color conversion part 272 may be blocked by the red color filter 220R. Accordingly, in the first light emitting area LA1, the first transmitted light L2R having a red color may pass through the second base substrate 210 and be emitted to the outside of the second substrate 200 (e.g., in the second direction D2).

The second color conversion part 274 may overlap the second light emitting area LA2. The second color conversion part 274 may convert the incident light L1B having a blue color into the second transmitted light L2G having a green color. For example, the second color conversion part 274 may include a resin 274a, a scatterer 274b, and a wavelength conversion particle 274c. The resin 274a and the scatterer 274b of the second color conversion part 274 may be substantially the same as or similar to the resin 272a and the scatterer 272b of the first color conversion part 272.

For example, the wavelength conversion particle 274c of the second color conversion unit 274 may include quantum dots that absorb blue light and emit green light. Accordingly, the second color conversion part 274 may convert the blue incident light L1B to emit the green second transmitted light L2G. The blue light not converted by the second color conversion part 274 may be blocked by the green color filter 220G. Accordingly, in the second light emitting area LA2, the second transmitted light L2G having a green color may pass through the second base substrate 210 and be emitted to the outside the second substrate 200 (e.g., in the second direction D2).

The light transmission part 276 may overlap the third light emitting area LA3. For example, the light transmission part 276 may include a resin 276a and a scatterer 276b. The resin 276a and the scatterer 276b of the light transmission part 276 may be substantially the same as or similar to the resin 272a and the scatterer 272b of the first color conversion part 272.

The light transmission part 276 may not convert the incident light L1B having a blue color. That is, the light transmission part 276 may emit the third transmitted light L2B having substantially the same wavelength as that of the incident light L1B. Accordingly, in the third light emitting area LA3, the third transmitted light L2B having a blue color may pass through the second base substrate 210 and be emitted to the outside the second substrate 200 (e.g., in the second direction D2).

In the first to third light emitting areas LA1, LA2, and LA3, as the first to third transmitted lights L2R, L2G, and L2B emitted to the outside the second substrate 200, through the second base substrate 210 are combined, the image may be displayed in the display area DA.

The second capping layer 280 may be disposed under the second base substrate 210. The capping layer 280 may be entirely disposed in the display area DA and the peripheral area PA. For example, the second capping layer 280 may cover the barrier rib structure 260, the first color conversion part 272, the second color conversion part 274, and the light transmission part 276 and the first capping layer 250. The second capping layer 280 may include an inorganic insulating material.

According to embodiments, the second substrate 200 of the display device 1000 may include the light blocking member 230 and the refractive layer 240 which covers the light blocking member 230. The light blocking member 230 may have the pattern groove PH, and a portion of the refractive layer 240 may fill the pattern groove PH. Accordingly, the shortest distance between the lower surface of the protruding patterns at the groove portion HP of the light blocking member 230, and the lower surface of the refractive layer 240, may be reduced. The shortest distance may correspond to or reflect a generally thickness of the refractive layer 240. In other words, the thickness of the refractive layer 240 exposed to the outside may be reduced since the distance between the light blocking member 230 and a lower surface the refractive layer 240 is reduced at locations corresponding to the protruding patterns of the light blocking member 230. Accordingly, it is possible to prevent or reduce the penetration of impurities such as external air and moisture into the inside of the display device 1000 through the refractive layer 240. Accordingly, the display quality of the display device 1000 may be improved.

FIGS. 5 to 9 are cross-sectional views illustrating a method of manufacturing or providing a color conversion substrate included in the display device 1000 of FIG. 3.

Hereinafter, a method of manufacturing the second substrate 200 included in the display device 1000 of FIG. 3 will be briefly described with reference to FIGS. 5 to 9.

Figure 5:
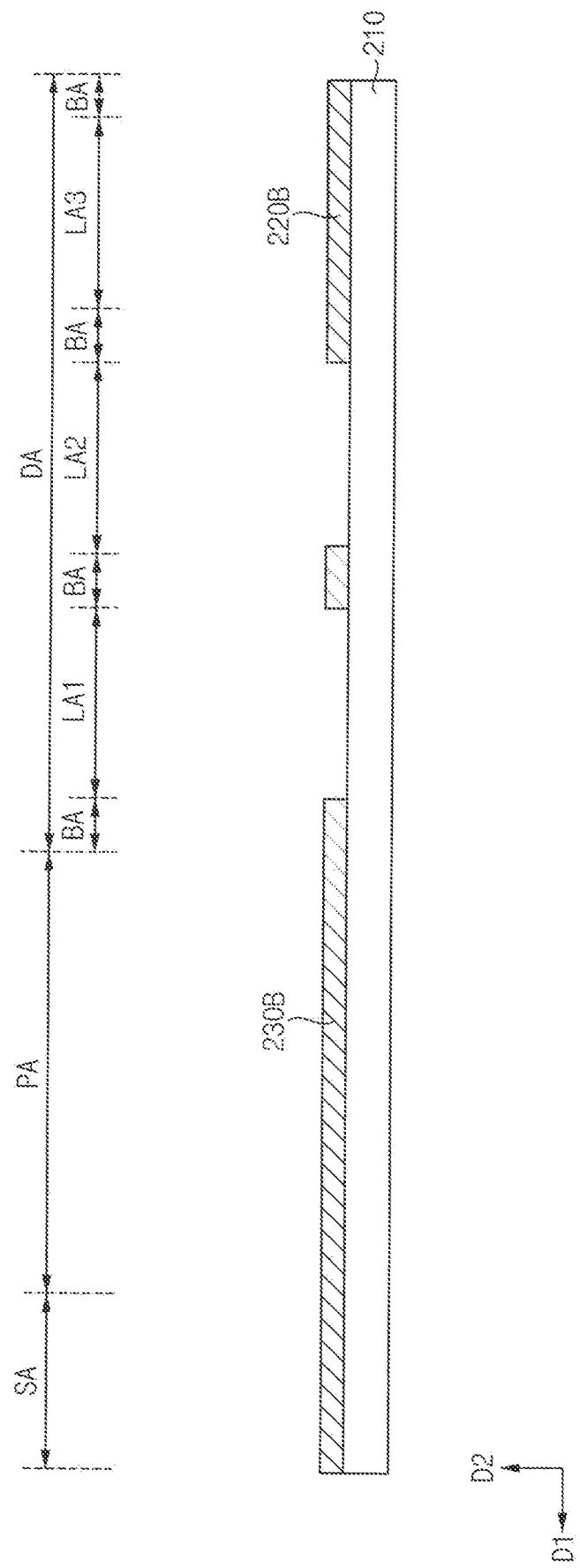
FIGS. 5 to 9 are cross-sectional views illustrating a method of manufacturing (or providing) a color conversion substrate included in the display device of FIG. 3.

Referring to FIG. 5, the blue color filter 220B may be formed (or provided) in the display area DA, on the second base substrate 210, and the first light blocking layer 230B may be formed in the peripheral area PA and the sealing area SA. The blue color filter 220B may be formed to overlap the third light emitting area LA3 and the light blocking area BA. The first light blocking layer 230B may be formed to surround the display area DA, as being in the peripheral area PA and the sealing area SA. In an embodiment, the blue color filter 220B and the first light blocking layer 230B may be formed substantially simultaneously, such as to be respective patterns of a same layer. That is, a portion of the blue color filter layer as a first color filter layer, may define a portion of the blue light blocking layer 230B.

Figure 6:
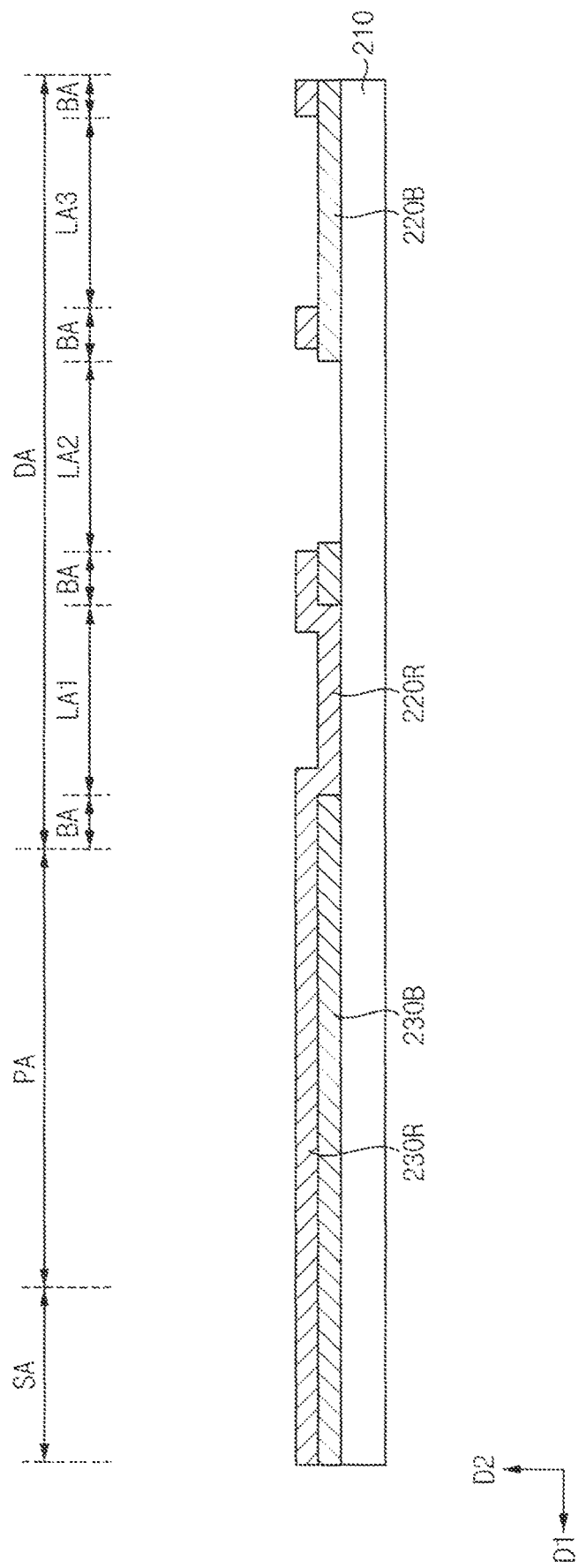

Referring to FIG. 6, the red color filter 220R may be formed in the display area DA, on the second base substrate 210, and the second light blocking layer 230R may be formed in the peripheral area PA and the sealing area SA. The red color filter 220R may be formed to overlap the first light emitting area LA1 and the light blocking area BA. The second light blocking layer 230R may be formed on the first light blocking layer 230B. In an embodiment, the red color filter 220R and the second light blocking layer 230R may be formed substantially simultaneously, such as to be respective patterns of a same layer. That is, a portion of the red color filter layer as a second color filter layer, may define a portion of the red light blocking layer 230R.

Figure 7:
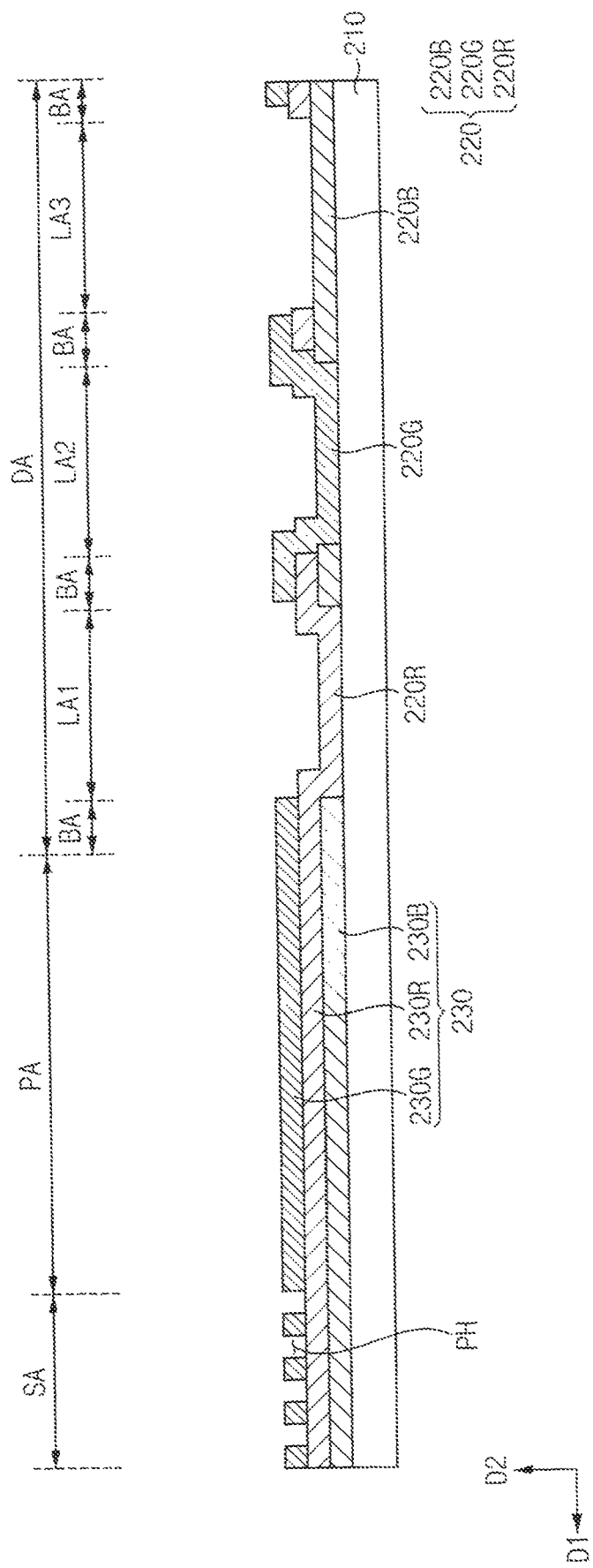

Referring to FIG. 7, the green color filter 220G may be formed in the display area DA on the second base substrate 210, and the third light blocking layer 230G may be formed in the peripheral area PA and the sealing area SA. The green color filter 220G may be formed to overlap the second light emitting area LA2 and the light blocking area BA. The third light blocking layer 230G may be formed on the second light blocking layer 230R. In an embodiment, the green color filter 220G and the third light blocking layer 230G may be formed substantially simultaneously, such as to be respective patterns of a same layer. That is, a portion of the green color filter layer as a third color filter layer, may define a portion of the green light blocking layer 230G.

The third light blocking layer 230G may include the pattern groove PH. In an embodiment, the pattern groove PH of the grooved area may be formed by selectively patterning the third light-blocking layer 230G at a specific position, by adjusting the light transmissive area and the non-transmissive area of the exposure mask in the process of forming the third light-blocking layer 230G. Solid portions of the blue color filter layer are spaced apart from each other along the base substrate, to define the pattern grooves PH respectively therebetween, at the grooved area corresponding to the sealing area SA.

Figure 8:
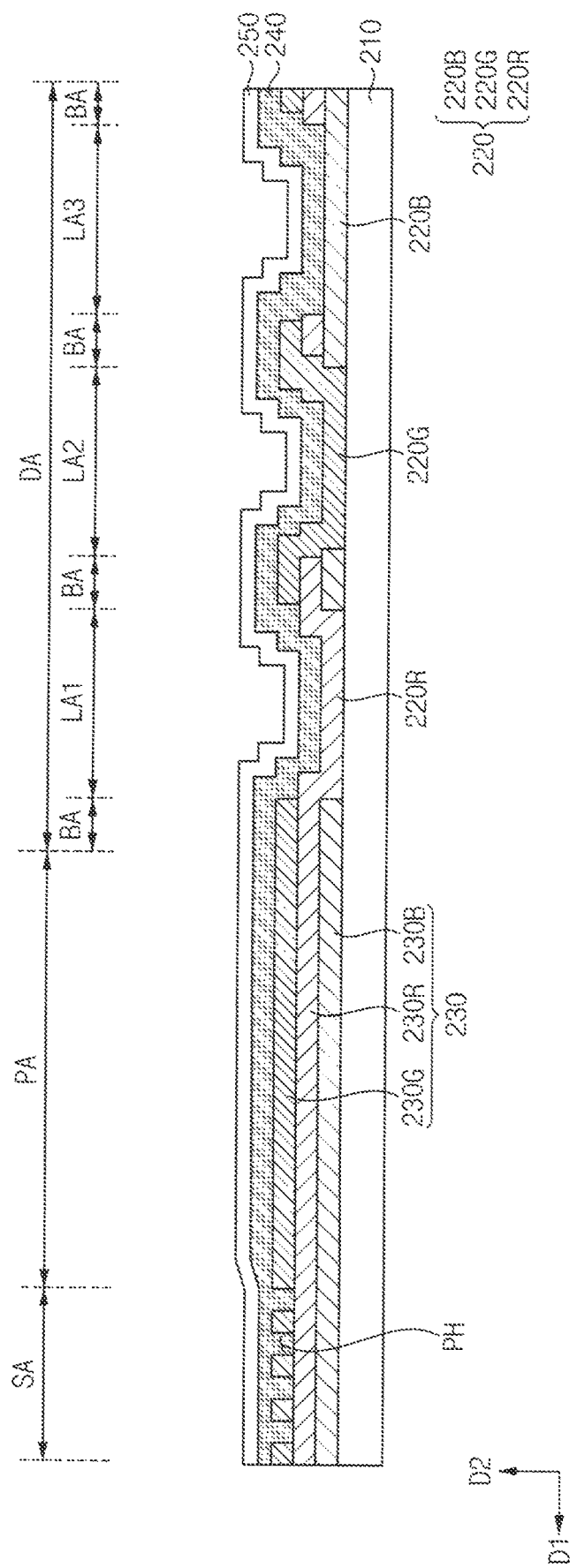

Referring to FIG. 8, the refractive layer 240 may be formed in the display area DA, the peripheral area PA, and the sealing area SA, on the second base substrate 210. The refractive layer 240 may be formed to surround (e.g., cover)

the color filter layer 220 and the light blocking member 230. In this case, a portion of the refractive layer 240 may extend from outside the grooved color filter layer, to inside the pattern groove PH, to fill the pattern groove PH. In an embodiment, the refractive layer 240 may be formed by coating, deposition, or the like. The first capping layer 250 may be formed in the display area DA, the peripheral area PA, and the sealing area SA, on the second base substrate 210. The first capping layer 250 may be formed to cover the refractive layer 240.

Figure 9:
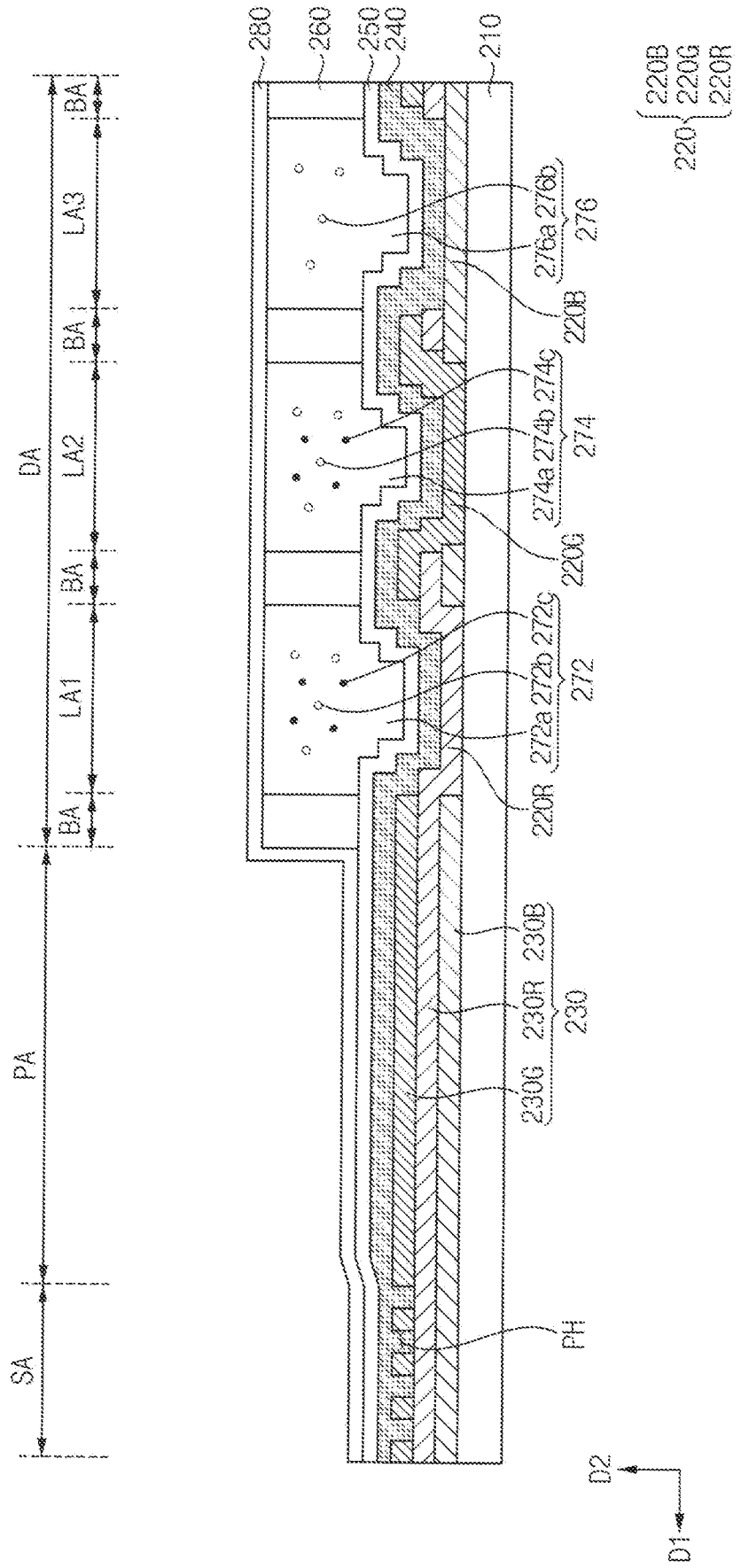

Referring to FIG. 9, the barrier rib structure 260 which forms a barrier rib layer, may be formed in the display area DA, on the color filter layer 220. The openings of the barrier rib layer which expose the first to third light emitting areas LA1, LA2, and LA3, respectively, to outside the barrier rib layer, may be formed in the barrier rib structure 260 such as by barrier ribs spaced apart from each other along the base substrate. The first color conversion part 272, the second color conversion part 274, and the light transmission part 276 may be respectively formed in the openings of the barrier rib structure 260. The second capping layer 280 covering the barrier rib structure 260, the first color conversion part 272, the second color conversion part 274, the light transmission part 276, and the light blocking member 230 may be formed.

The various layers described above may be directly provided on a previous layer, without being limited thereto. The various layers described above for the second substrate 200 may contact each other, such as to form an interface therebetween, without being limited thereto.

FIGS. 10 to 17 are cross-sectional views illustrating display devices according to embodiments.

Figure 15:
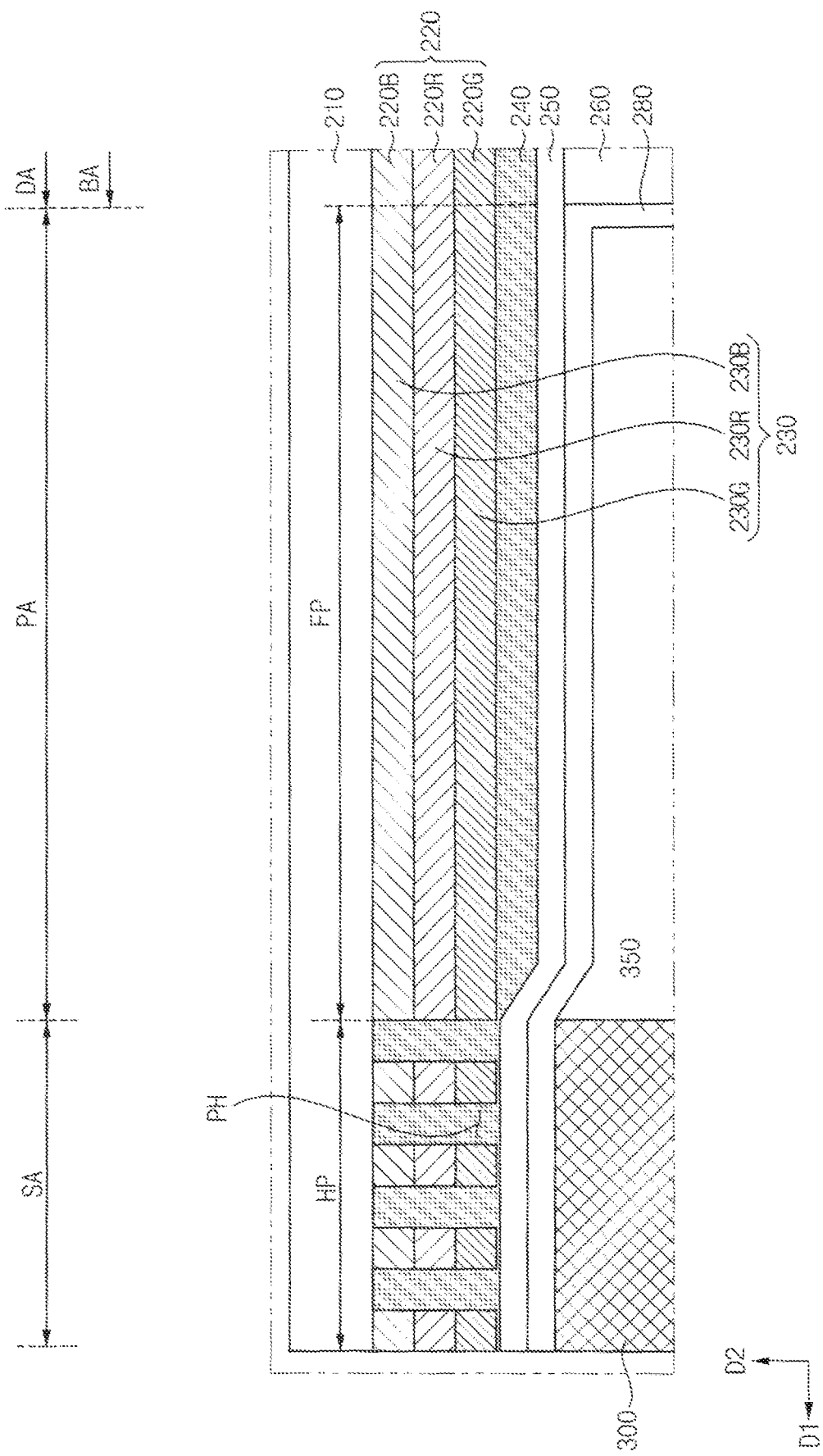
Figure 16:
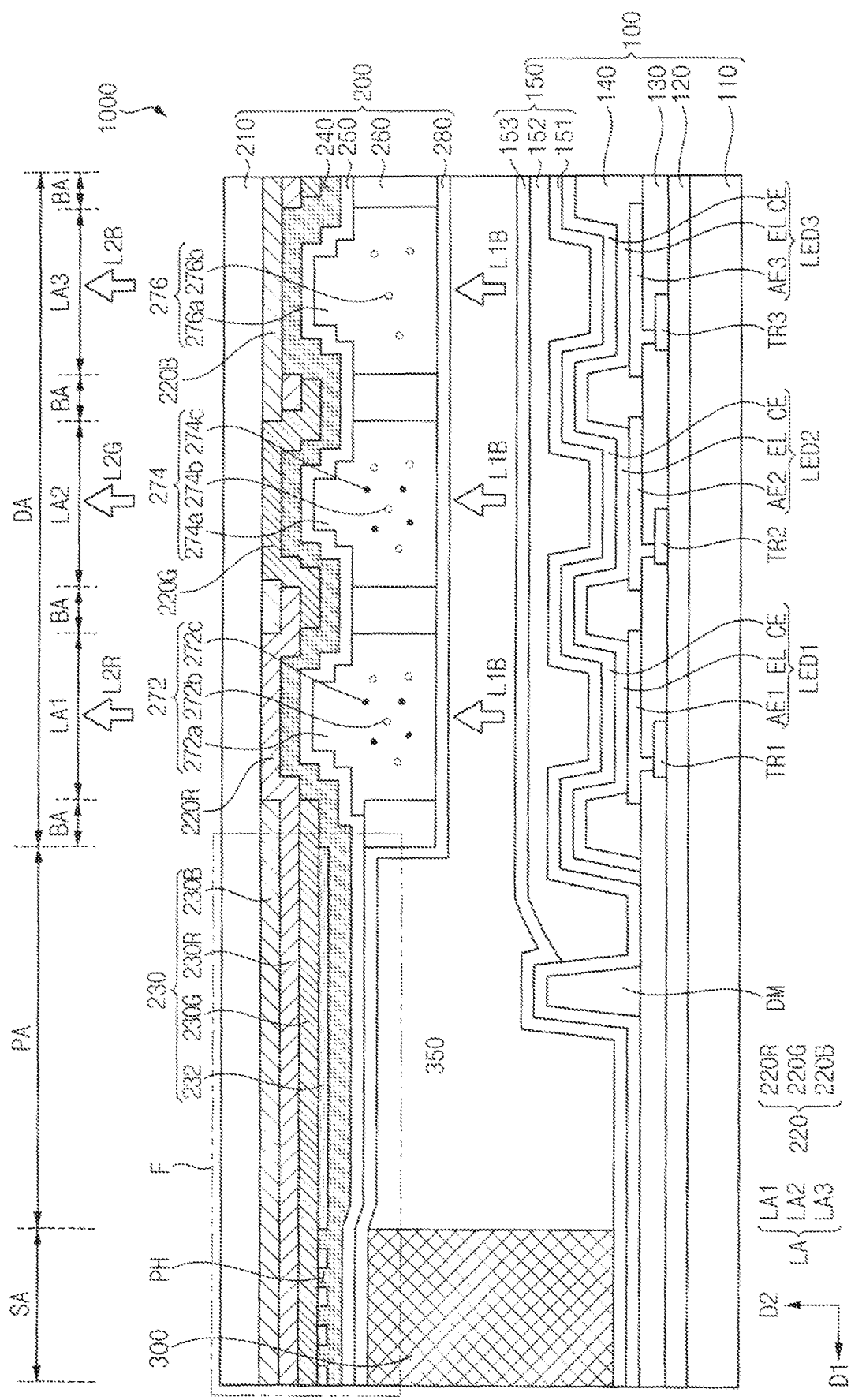

For example, each of FIGS. 10, 12, 14, and 16 may correspond to the cross-sectional view of FIG. 3. FIG. 11 may be an enlarged view of area 'C' of FIG. 10. FIG. 13 may be an enlarged view of area 'D' of FIG. 12. FIG. 15 may be an enlarged view of area 'E' of FIG. 14. FIG. 16 may be an enlarged view of area 'F' of FIG. 15. In the following description, differences from the display device 1000 described with reference to FIGS. 3 and 4 will be mainly described, and overlapping descriptions will be omitted or simplified.

Figure 10:
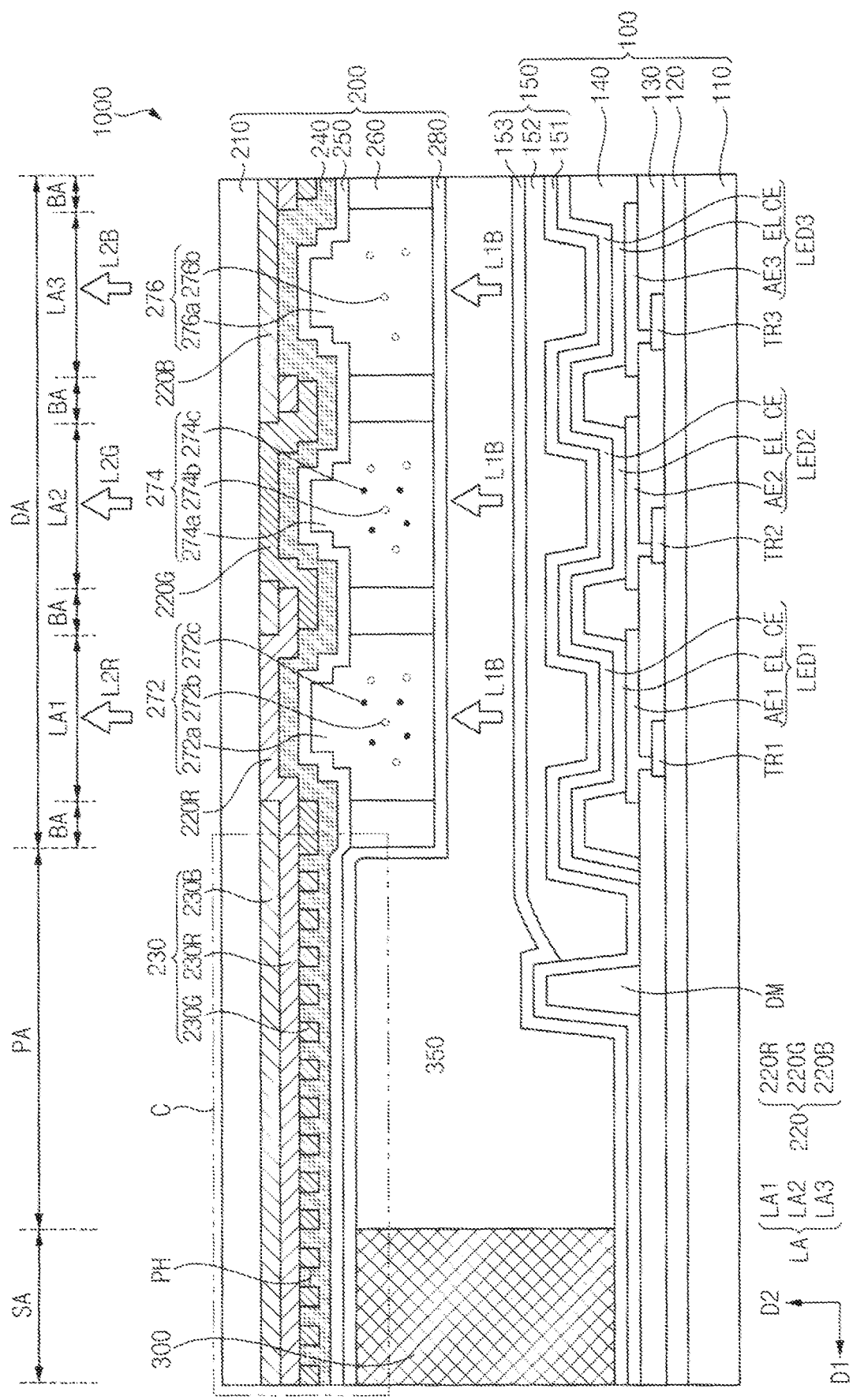
FIGS. 10 to 17 are cross-sectional views respectively illustrating display devices according to embodiments.
Figure 11:
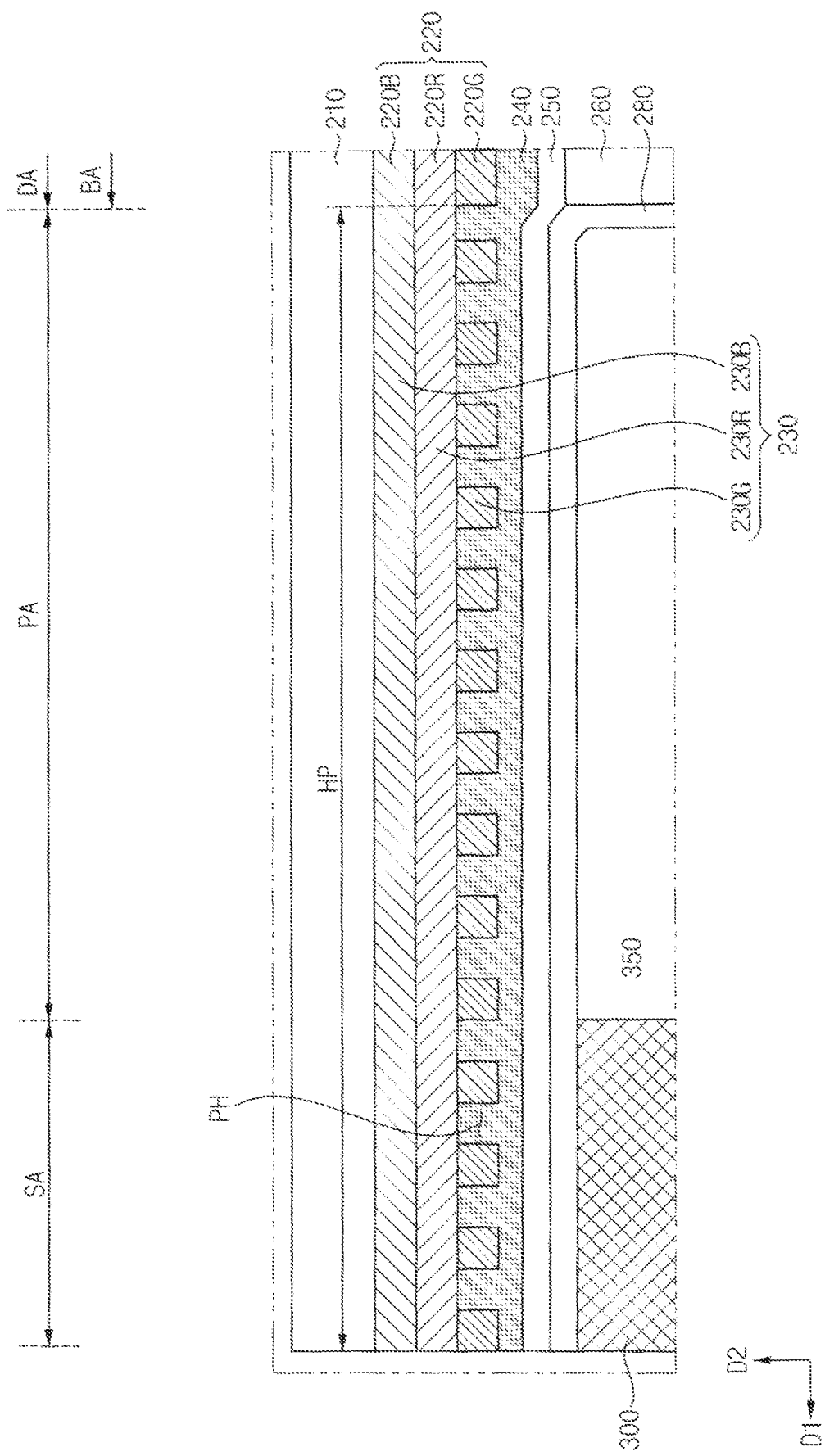

Referring to FIGS. 10 and 11, in an embodiment, the pattern groove PH may be disposed in both the sealing area SA and the peripheral area PA. In other words, the groove portion HP of the light blocking member 230 may extend along the first direction D1, from the sealing area SA, to overlap both the sealing area SA and the peripheral area PA. In an embodiment, the pattern groove PH may be adjacent to the display area DA. In other words, in the peripheral area PA, a closest protruding portion of the light blocking member 230 may be closest to the display area DA and may define a closest pattern groove PH which is closest to the display area DA. In this case, the flat portion FP of the light blocking member 230 may be omitted, and a grooved portion may be provided in an entirety of the sealing area SA and an entirety of the peripheral area PA. According to an embodiment, an area of the refractive layer 240 that overlaps with the groove portion HP of the light blocking member 230 may also extend in the first direction D1, from the display area DA, so that overlaps both the sealing area SA and the peripheral area PA. Accordingly, it is possible to reduce a phenomenon in which external impurities penetrate the inside of the second substrate 200 through the refractive layer 240.

Figure 12:
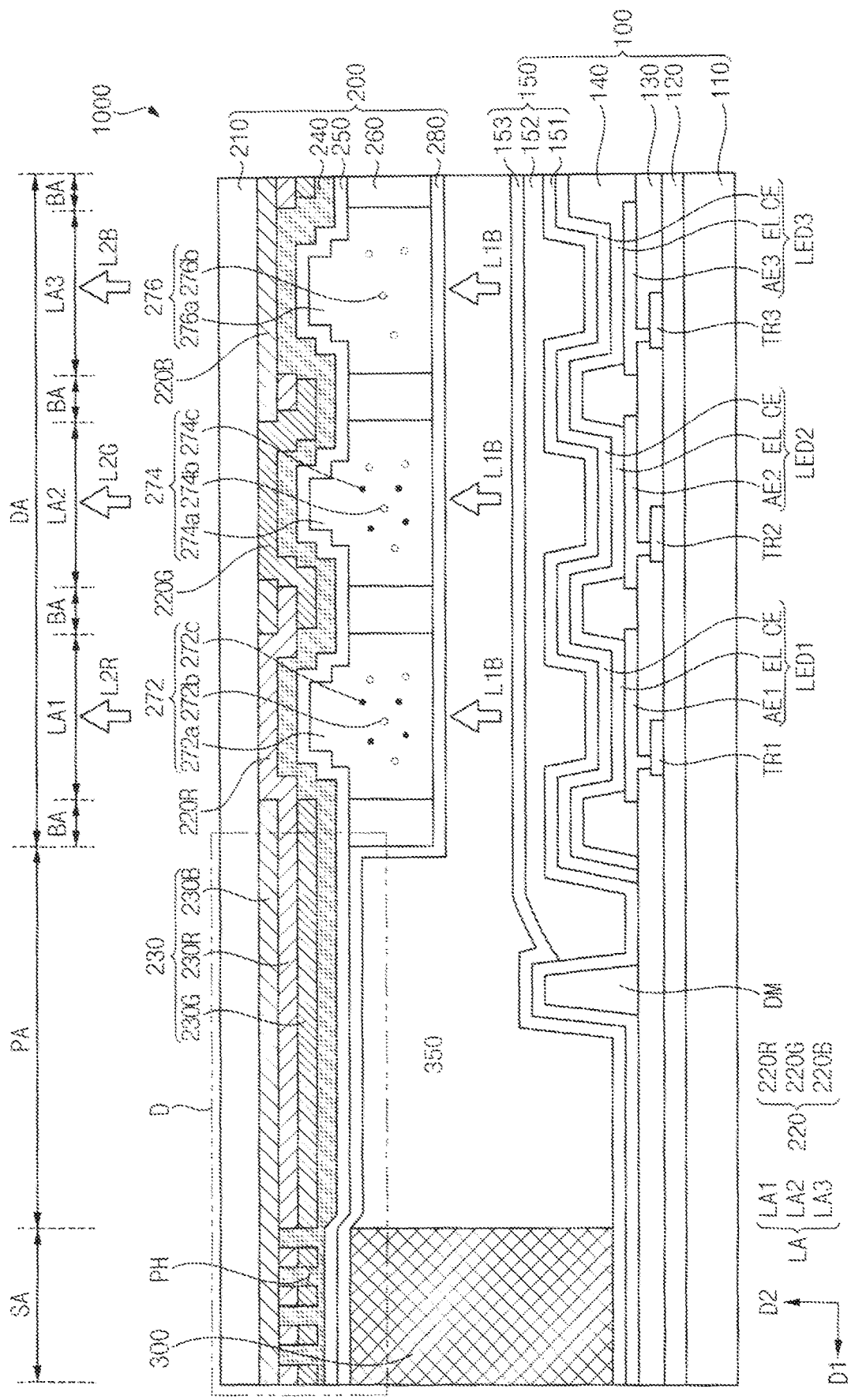
Figure 13:
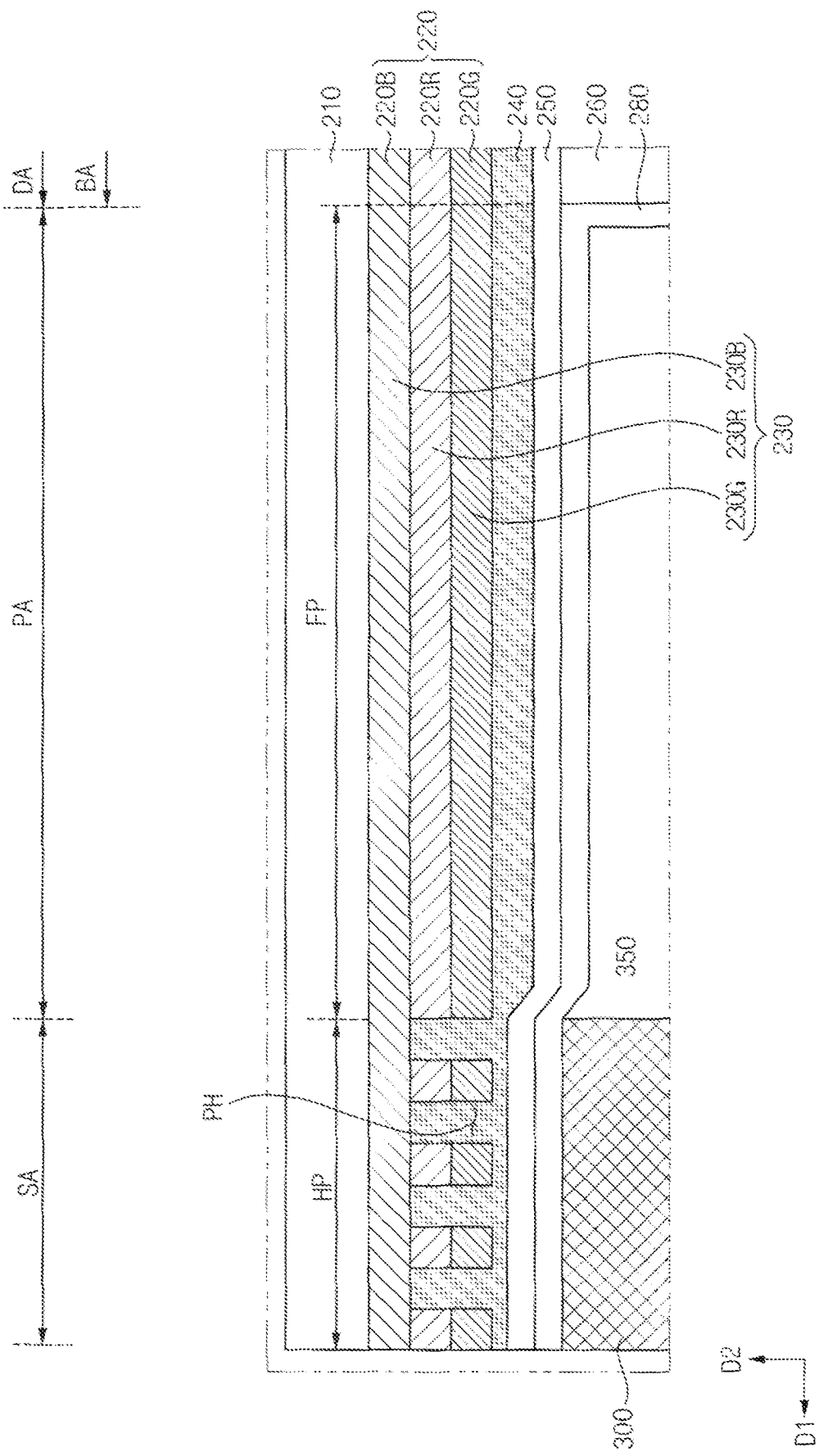

Referring to FIGS. 12 and 13, in an embodiment, the pattern groove PH may penetrate thicknesses of the second light blocking layer 230R and the third light blocking layer 230G, and expose a portion of the first light blocking layer 230B to outside two color filter layers. For example, after selectively patterning the second light blocking layer 230R at a specific position, the third light blocking layer 230G may be selectively patterned to correspond a solid portion thereof to the position of a solid portion of the second light blocking layer 230R. The second color filter layer may define a plurality of second grooves (e.g., the pattern grooves PH in the second light blocking layer 230R) and the third color filter layer may define a plurality of third grooves (e.g., the pattern grooves PH in the third light blocking layer 230G), where the second grooves and the third grooves are respectively aligned with each other to form the pattern grooves PH shown in FIGS. 12 and 13. A solid portion of the second color filter layer and a solid portion of the third color filter layer may be aligned with each other, to form a protruding portion of the light blocking member 230. The pattern groove PH may be filled by a portion of the refractive layer 240 in the process of forming the refractive layer 240.

According to an embodiment, as the pattern groove PH is formed to penetrate a total thickness of the second light blocking layer 230R and the third light blocking layer 230G, a portion of the refractive layer 240 that is filled in the pattern groove PH may increase. Accordingly, the shortest distance between the lower surface of the protruding portion of the light blocking member 230, and the lower surface of the refractive layer 240, may be reduced. Accordingly, the thickness of the refractive layer 240 exposed to the outside may be reduced. Accordingly, it is possible to reduce a phenomenon in which external impurities penetrate the inside of the display device 1000, through the refractive layer 240, from outside the refractive layer 240.

Figure 14:
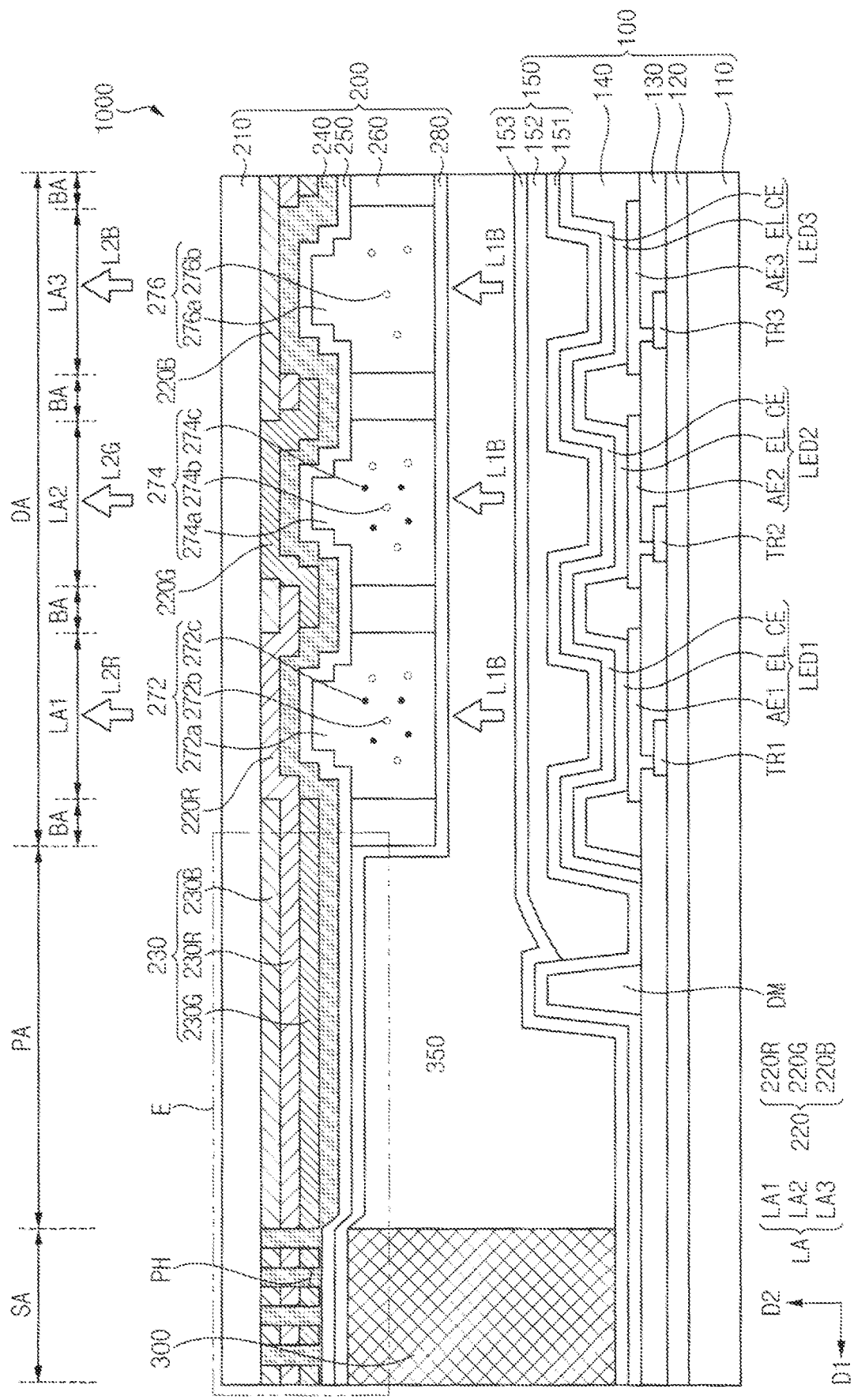

Referring to FIGS. 14 and 15, in an embodiment, the pattern groove PH may penetrate thicknesses of the first light blocking layer 230B, the second light blocking layer 230R, and the third light blocking layer 230G and expose a portion of the base substrate 210 to outside the light blocking member 230 and outside of three color filter layers. For example, after selectively patterning the first light blocking layer 230B at a specific position, the second light-blocking layer 230R may be selectively patterned corresponding to the position of a solid portion of the first light blocking layer 230B. The third light blocking layer 230G may be selectively patterned to correspond to the positions of the solid portions of the first light blocking layer 230B and the second light blocking layer 230R. The first color filter layer may define a plurality of first grooves (e.g., the pattern grooves PH in the first light blocking layer 230B), the second color filter layer may define a plurality of second grooves (e.g., the pattern grooves PH in the second light blocking layer 230R) and the third color filter layer may define a plurality of third grooves (e.g., the pattern grooves PH in the third light blocking layer 230G), where the first grooves, the second grooves and the third grooves are respectively aligned with each other to form the pattern grooves PH shown in FIGS. 14 and 15. A solid portion of the first color filter layer, a solid portion of the second color filter layer and a solid portion of the third color filter layer may be aligned with each other, to form a protruding portion of the light blocking member 230. The pattern groove PH may be filled by a portion of the refractive layer 240 in the process of forming the refractive layer 240.

According to an embodiment, as the pattern groove PH is formed to penetrate thicknesses of all the first to third light blocking layers 230B, 230R, and 230G, a portion of the refractive layer 240 filled in the pattern groove PH may increase. Accordingly, the shortest distance between the lower surface of the protruding portion of the light blocking member 230, and the lower surface of the refractive layer 240, may be reduced. Accordingly, the thickness of the refractive layer 240 exposed to the outside may be reduced. Accordingly, it is possible to reduce a phenomenon in which external impurities penetrate the inside of the display device 1000 through the refractive layer 240.

Figure 17:
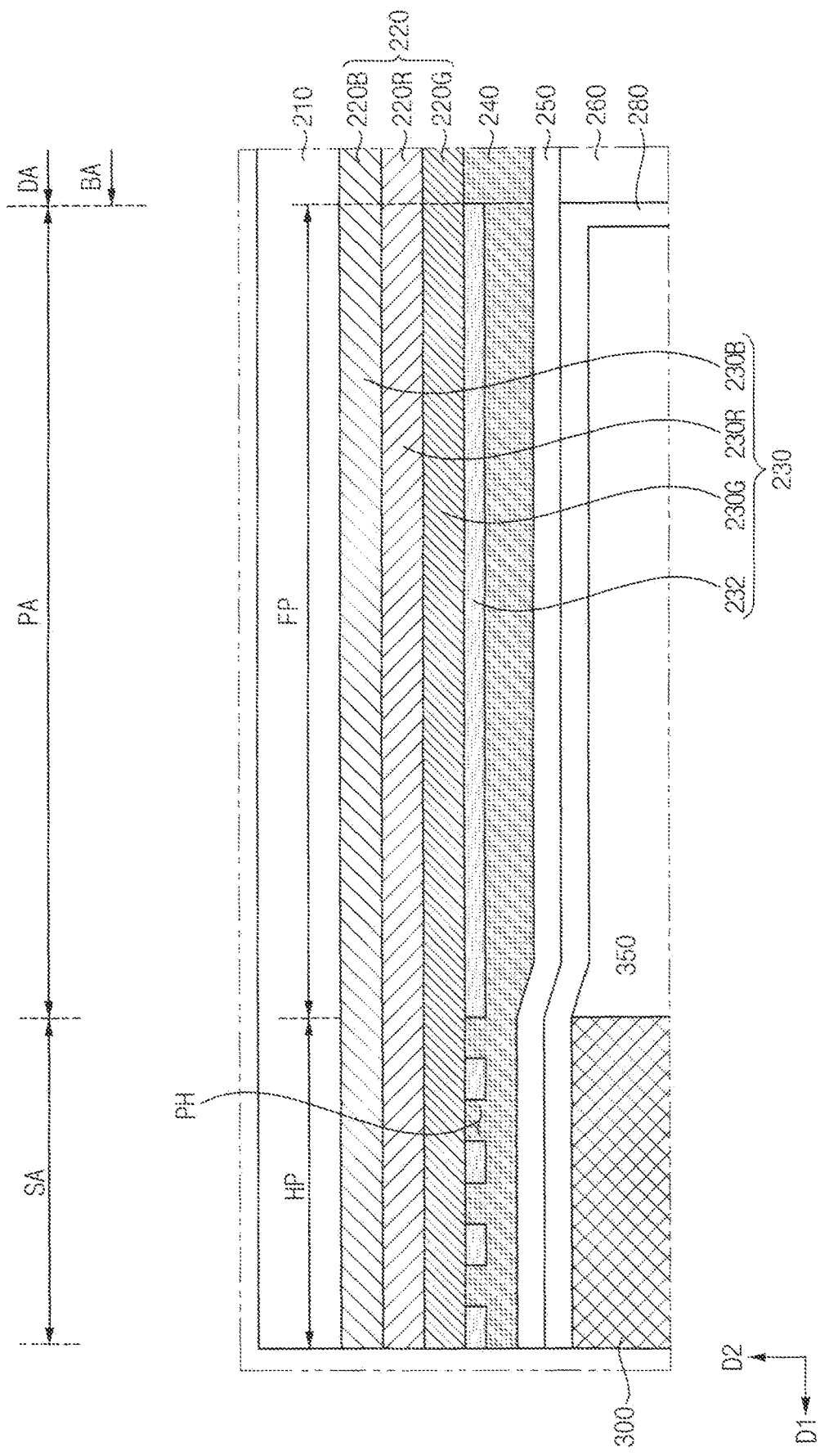

Referring to FIGS. 16 and 17, in an embodiment, the light blocking member 230 may further include an organic layer 232. The organic layer 232 may be disposed under the third light blocking layer 230G. In other words, the organic layer 232 may be the outermost layer of the second substrate 200 which is closest to the refractive layer 240. In an embodiment, the organic layer 232 may extend in the first direction D1 and may be disposed in the sealing area SA and the peripheral area PA. However, the invention is not necessarily limited thereto, and in an embodiment, the organic layer 232 may be disposed only in the sealing area SA.

In an embodiment, the organic layer 232 may include an organic insulating material. Examples of the organic insulating material may include photoresist, polyacryl-based resin, polyimide-based resin, polyamide-based resin, siloxane-based resin, acryl-based resin, epoxy-based resin, and the like. These may be used alone or in combination with each other. For example, the organic layer 232 may be a light control layer for controlling light, a spacer for compensating for a step, or the like.

In an embodiment, the pattern groove PH may penetrate the organic layer 232 and expose a portion of the third light blocking layer 230G to outside the light blocking member 230. For example, the pattern groove PH may be formed by selectively patterning the organic layer 232 at a specific position. However, the invention is not necessarily limited thereto. For example, the pattern groove PH may be formed to penetrate the organic layer 232 and the third light blocking layer 230G. Also, the pattern groove PH may be formed to penetrate the organic layer 232, the second light blocking layer 230R, and the third light blocking layer 230G. Also, the pattern groove PH may be formed to penetrate all the organic layer 232 and the first to third light blocking layers 230B, 230R, and 230G.

According to embodiments, the color conversion substrate of the display device 1000 may include the light blocking member 230 and the refractive layer 240 which covers the light blocking member 230. The color conversion substrate may further include layers of the second substrate 200 inclusive of the refractive layer 240 to the second capping layer 280, without being limited thereto. The light blocking member 230 may have the pattern groove PH and protruding portions which define the pattern groove PH, and a portion of the refractive layer 240 may fill the pattern groove PH. Accordingly, the shortest distance between the lower surface of the protruding portions which define the groove portion HP of the light blocking member 230, and the lower surface of the refractive layer 240, may be reduced. In other words, the thickness of the refractive layer 240 exposed to the outside thereof may be reduced. That is, to reduce a thickness of a refractive layer 240 at an outer area (e.g., a sealing area SA and/or a peripheral area PA), protruding portions of an overlying layer (e.g., a color filter material layer and/or an organic material layer) occupy a thickness portion or a volume of the refractive layer 240 at various positions along the refractive layer 240. Accordingly, it is possible to prevent or reduce the penetration of impurities such as external air and moisture into the inside of the display device 1000 through the refractive layer 240. Accordingly, the display quality of the display device 1000 may be improved.

What is claimed is:

1. A color conversion substrate comprising:
   a base substrate including a display area and a non-display area which is adjacent to the display area in a first direction;
   a color filter layer in the display area, on the base substrate;
   a light blocking member in the non-display area, on the base substrate, the light blocking member extending in the first direction and defining:
     a pattern groove of the light blocking member which is in the non-display area,
     a grooved area including the pattern groove;
     protruding portions of the light blocking member spaced apart from each other which define the pattern groove therebetween; and
     a flat portion which is between the grooved area and the display area, in the first direction; and
   a refractive layer facing the base substrate with both the color filter layer and the light blocking member therebetween, the refractive layer extending into the pattern groove of the light blocking member,
   wherein
     the refractive layer, the flat portion of the light blocking member, and each protruding portion among the protruding portions of the light blocking member, has a lower surface which is furthest from the base substrate, and
     a first shortest distance between the lower surface of the each protruding portion of the light blocking member and the lower surface of the refractive layer, is smaller than a second shortest distance between the lower surface of the flat portion of the light blocking member and the lower surface of the refractive layer.

2. The color conversion substrate of claim 1, wherein the refractive layer which extends into the pattern groove of the light blocking member fills the pattern groove.

3. The color conversion substrate of claim 1, wherein the first shortest distance is about 0.5 micrometer or less.

4. The color conversion substrate of claim 1, wherein the non-display area includes:
   a sealing area at which the color conversion substrate is bonded to a display substrate which generates and emits incident light toward the color conversion substrate, and
   a peripheral area between the display area and the sealing area, and the pattern groove is in the sealing area.

5. The color conversion substrate of claim 4, wherein
   in the sealing area, the color conversion substrate is bonded to the display substrate by a sealing member, and
   the pattern groove of the light blocking layer overlaps the sealing member, in the sealing area.

6. The color conversion substrate of claim 1, wherein the light blocking member includes in order from the base substrate:
   a first light blocking layer;
   a second light blocking layer overlapping the first light blocking layer in a second direction along a thickness direction of the color conversion substrate; and
   a third light blocking layer overlapping the first light blocking layer and the second light blocking layer, in the second direction.

7. The color conversion substrate of claim 6, wherein the pattern groove of the light blocking member penetrates the third light blocking layer and exposes the second light blocking layer to outside the light blocking member.

8. The color conversion substrate of claim 6, wherein the pattern groove of the light blocking member penetrates the second light blocking layer and the third light blocking layer, and exposes the first light blocking layer to outside the light blocking member.

9. The color conversion substrate of claim 6, wherein the pattern groove of the light blocking member penetrates the first light blocking layer, the second light blocking layer and the third light blocking layer, and exposes the base substrate to outside the light blocking member.

10. The color conversion substrate of claim 6, wherein the light blocking member further includes:
an organic layer facing the base substrate with the first to third light blocking layers therebetween, the organic layer overlapping the first to third light blocking layers, in the second direction, and
wherein, the pattern groove of the light blocking member penetrates the organic layer, and exposes the third light blocking layer to outside the light blocking member.

11. The color conversion substrate of claim 6, wherein the first light blocking layer is a blue light blocking layer, the second light blocking layer is a red light blocking layer, and the third light blocking layer is a green light blocking layer.

12. The color conversion substrate of claim 11, wherein
the color filter layer includes a red color filter of a red color filter layer, a green color filter of a green color filter layer and a blue color filter of a blue color filter layer,
the red color filter and the red light blocking layer are respective portions of the red color filter layer,
the green color filter and the green light blocking layer are respective portions of the green color filter layer, and
the blue color filter and the blue light blocking layer are respective portions of the blue color filter layer.

13. The color conversion substrate of claim 12, further comprising a color conversion layer including:
a first color conversion pattern corresponding to the red color filter;
a second color conversion pattern corresponding to the green color filter; and
a light transmission pattern corresponding to the blue color filter.

14. The color conversion substrate of claim 13, wherein
the first color conversion pattern includes first wavelength conversion particles which convert an incident light into a light having a red color,
the second color conversion pattern includes second wavelength conversion particles which convert the incident light into a light having a green color, and
the light transmission pattern includes a light scatterer which scatters the incident light.

15. The color conversion substrate of claim 1, further comprising a capping layer which faces the base substrate with the refractive layer therebetween.

16. A color conversion substrate comprising:
a base substrate including a display area and a non-display area which is adjacent to the display area in a first direction;
a color filter layer in the display area, on the base substrate;
a light blocking member in the non-display area, on the base substrate, the light blocking member extending in the first direction and defining a pattern groove of the light blocking member, the pattern groove being in the non-display area; and
a refractive layer facing the base substrate with both the color filter layer and the light blocking member therebetween,
wherein
the refractive layer extends into the pattern groove of the light blocking member, and
the non-display area includes:
a sealing area at which the color conversion substrate is bonded to a display substrate which generates and emits incident light toward the color conversion substrate, and
a peripheral area between the display area and the sealing area, and the pattern groove is in the sealing area and in the peripheral area.

17. The color conversion substrate of claim 16, wherein within the peripheral area,
a closest protruding portion among the protruding portions of the light blocking member is closest to the display area,
the closest protruding portion defines a closest pattern groove which is closest to the display area among the plurality of pattern grooves.

18. A display device comprising:
a display area and a non-display area which is adjacent to the display area in a first direction;
a color conversion substrate facing the display area and the non-display area;
a display substrate which generates light at the display area and emits generated light to the color conversion substrate; and
a sealing member which bonds the display substrate to the color conversion substrate, in the non-display area,
wherein the color conversion substrate includes:
a base substrate;
a color filter layer in the display area, on the base substrate;
a light blocking member in the non-display area, on the base substrate, the light blocking member extending in the first direction and defining:
a pattern groove of the light blocking member which is in the non-display area;
a grooved area including the pattern groove;
protruding portions of the light blocking member spaced apart from each other which define the pattern groove therebetween; and
a flat portion which is between the grooved area and the display area, in the first direction and
a refractive layer facing the base substrate with the color filter layer and the light blocking member therebetween, the refractive layer extending into the pattern groove of the light blocking member,
wherein
the refractive layer, the flat portion of the light blocking member, and each protruding portion among the protruding portions of the light blocking member, has a lower surface which is furthest from the base substrate, and
a first shortest distance between the lower surface of the each protruding portion of the light blocking member and the lower surface of the refractive layer, is smaller than a second shortest distance between the lower surface of the flat portion of the light blocking member and the lower surface of the refractive layer.

19. The display device of claim 18, wherein the refractive layer which extends into the pattern groove of the light blocking member fills the pattern groove.

20. The display device of claim 18, wherein the sealing member overlaps the pattern groove of the light blocking member.

\* \* \* \* \*